United States Patent
Akita et al.

(10) Patent No.: US 8,390,053 B2
(45) Date of Patent: Mar. 5, 2013

(54) NONVOLATILE SEMICONDUCTOR DEVICE INCLUDING A FIELD EFFECT TRANSISTOR HAVING A CHARGE STORAGE LAYER OF PREDETERMINED LENGTH

(75) Inventors: Kenichi Akita, Chigasaki (JP); Daisuke Okada, Kunitachi (JP); Keisuke Kuwahara, Fujimino (JP); Yasufumi Morimoto, Nishinomiya (JP); Yasuhiro Shimamoto, Tokorozawa (JP); Kan Yasui, Kodaira (JP); Tsuyoshi Arigane, Akishima (JP); Tetsuya Ishimaru, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 236 days.

(21) Appl. No.: 12/188,412

(22) Filed: Aug. 8, 2008

(65) Prior Publication Data
US 2009/0050955 A1    Feb. 26, 2009

(30) Foreign Application Priority Data

Aug. 24, 2007  (JP) ................ 2007-218147

(51) Int. Cl.
*H01L 29/792*  (2006.01)
(52) U.S. Cl. ........ 257/324; 257/314; 257/321; 257/322; 257/E21.423; 257/E29.309
(58) Field of Classification Search ............. 257/314, 257/321, 322, 324, E21.423, E29.309
See application file for complete search history.

(56) References Cited

U.S. PATENT DOCUMENTS

| 5,768,192 | A | 6/1998 | Eitan |
| 6,335,554 | B1 * | 1/2002 | Yoshikawa .................. 257/316 |
| 6,927,131 | B2 * | 8/2005 | Kim ............................. 438/261 |
| 7,576,386 | B2 | 8/2009 | Lue et al. |

(Continued)

FOREIGN PATENT DOCUMENTS

| CN | 1677675 A | 10/2005 |
| CN | 1909251 A | 2/2007 |

(Continued)

OTHER PUBLICATIONS

TW Office Action in TW Application No. 097111859, dated May 10, 2012.

(Continued)

*Primary Examiner* — Andy Huynh
(74) *Attorney, Agent, or Firm* — Mattingly & Malur, P.C.

(57) ABSTRACT

A charge storage layer interposed between a memory gate electrode and a semiconductor substrate is formed shorter than a gate length of the memory gate electrode or a length of insulating films so as to make the overlapping amount of the charge storage layer and a source region to be less than 40 nm. Therefore, in the write state, since the movement in the transverse direction of the electrons and the holes locally existing in the charge storage layer decreases, the variation of the threshold voltage when holding a high temperature can be reduced. In addition, the effective channel length is made to be 30 nm or less so as to reduce an apparent amount of holes so that coupling of the electrons with the holes in the charge storage layer decreases; therefore, the variation of the threshold voltage when holding at room temperature can be reduced.

11 Claims, 26 Drawing Sheets

U.S. PATENT DOCUMENTS

| | | | |
|---|---|---|---|
| 2004/0119107 A1 | 6/2004 | Hisamoto et al. | |
| 2005/0224859 A1 | 10/2005 | Iwata et al. | |
| 2005/0230736 A1 | 10/2005 | Ishimaru et al. | |
| 2005/0281086 A1 | 12/2005 | Kobayashi et al. | |
| 2006/0086970 A1* | 4/2006 | Kim | 257/321 |
| 2006/0234454 A1* | 10/2006 | Yasui et al. | 438/267 |
| 2006/0249782 A1 | 11/2006 | Yoshino | |
| 2008/0029805 A1* | 2/2008 | Shimamoto et al. | 257/315 |
| 2009/0280611 A1 | 11/2009 | Lue et al. | |

FOREIGN PATENT DOCUMENTS

| | | |
|---|---|---|
| JP | 5-048113 | 2/1993 |
| JP | 5-121700 | 5/1993 |
| JP | 2004-186452 | 7/2004 |
| JP | 2006-005078 | 1/2006 |
| JP | 2006-278987 | 10/2006 |
| KR | 10-0659026 B1 | 12/2006 |
| WO | 03/075359 A1 | 9/2003 |

OTHER PUBLICATIONS

JP Office Action in JP Application No. 2007-218147, dated Aug. 14, 2012.

Taiwanese Office Action issued Sep. 21, 2012 in corresponding application No. 097123955.

* cited by examiner

| | Vmg (V) | Vs (V) | Vcg (V) | Vd (V) | Vsub (V) |
|---|---|---|---|---|---|
| Read | 0 | 0 | 1.5 | 1 | 0 |
| Write | 8.5 | 4.5 | 1 | 0.4 | 0 |
| Erase | -6 | 6 | 0 | 1.5 | 0 |

|       | Vmg(V) | Vs(V) | Vd(V) | Vsub(V) |
|-------|--------|-------|-------|---------|
| Read  | 0      | 0     | 1     | 0       |
| Write | 8.5    | 4.5   | 0.4   | 0       |
| Erase | -6     | 6     | 1.5   | 0       | ical use. However, since
NONVOLATILE SEMICONDUCTOR DEVICE INCLUDING A FIELD EFFECT TRANSISTOR HAVING A CHARGE STORAGE LAYER OF PREDETERMINED LENGTH

CROSS-REFERENCE TO RELATED APPLICATION

The present application claims priority from Japanese Patent Application No. JP 2007-218147 filed on Aug. 24, 2007, the content of which is hereby incorporated by reference into this application.

TECHNICAL FIELD OF THE INVENTION

The present invention relates to a semiconductor device and a manufacturing technology thereof. More particularly, the present invention relates to a technology effectively applied to a semiconductor device having a MONOS (Metal Oxide Nitride Oxide Semiconductor) memory cell or an NROM memory cell that uses a nitride film as a charge storage layer.

BACKGROUND OF THE INVENTION

Embedding a nonvolatile memory cell and a logic semiconductor device together on the same silicon substrate allows obtaining a high-performance semiconductor device. These semiconductor devices are widely used for industrial machines, household appliances, devices mounted on vehicles, and the like as an incorporated type microcomputer. Generally, a program needed for the microcomputer is stored in the nonvolatile memory embedded together, and is read for use as necessary.

In nonvolatile memory cells in practical use today, field effect transistors for storage are used, in which a threshold voltage varies with accumulation of an electric charge. The electric charge holding system of the field effect transistor for storage includes the floating gate system (refer to Japanese Patent Application Laid-Open Publication No. H05-121700 (Patent Document 1), for example) that stores an electric charge in a conductive material electrically isolated, and the MONOS system (refer to Japanese Patent Application Laid-Open Publication No. H05-048113 (Patent Document 2), for example) that stores electric charges in an insulator, such as a silicon nitride film, with a property to accumulate an electric charge.

The floating gate system has good characteristics for holding an electric charge, and widely used for flash memories for storing programs in cellular phones and large capacity flash memories for storing data, etc. However, maintenance of the capacitive coupling ratio needed for the potential control of the floating gate is increasingly complex with finer design rules, and memory cell structures are becoming more complicated. In addition, the thickness of an oxide film surrounding the floating gate must be 8 nm or more to control the leakage of a holding electric charge, the limit of the finer design rules aiming at high speed and high integration is approaching. Since the electric charge is stored in the conductive material, a single defect that could be a leakage path in the oxide film around the floating gate extremely shorten a period for holding an electric charge.

On the other hand, the MONOS system generally has poor characteristics for holding an electric charge than the floating gate system, and the threshold voltage tends to drop logarithmically with time. Therefore, although the MONOS system has been known for many years, only a small portion of products has used the system in practical use. However, since the MONOS system uses a discrete storage system that stores the electric charge in the insulator, existence of some leakage paths does not cause all the holding electric charge to be lost, and the MONOS system is advantageously tolerant to a defect of an oxide film surrounding the insulator. Therefore, the MONOS system has been paid attention to in recent years with the advancement of finer design rules. Since a thin oxide film of 8 nm or less can be applied, the system is suitable for finer design rules, reliability can be easily estimated since the time for holding an electric charge is not extremely shortened by a defect that happens with low probability, and the memory cell structure is simple and the system can be easily embedded together with a logic circuit section.

The simplest memory cell with the MONOS system includes the NROM structure (refer to U.S. Pat. No. 5,768, 192 (Patent Document 3), and Japanese Patent Application Laid-Open Publication No. 2004-186452 (Patent Document 4), for example). This structure replaces the gate insulating film of the field effect transistor with the ONO film structure comprising an oxide film/nitride film/oxide film, and the CHE (Channel Hot Electron) system is used for writing, and the BTBT (Band-To-Band Tunneling) system with the interband tunneling is used for erasing. Simple formation processes thereof makes the system suitable for finer design rules and embedding together with the logic circuit section.

Another memory cell suitable for embedding together with a logic circuit section includes a split-gate type memory cell comprising a field effect transistor for selection, and a field effect transistor for a memory. This memory cell is suitable for embedding together because a faster writing operation and a smaller power supply can be provided with the SSI (Source Side Injection) system having good injection efficiency, and because the area of a peripheral circuit can be reduced since the transistor that selects this memory cell and the transistor connected thereto can be constituted with a transistor of a low voltage system with a small device area.

A split-gate type memory cell especially suitable for finer design rules includes a memory cell with a structure that forms one of the field effect transistors with a sidewall using self aligning (refer to Japanese Patent Application Laid-Open Publication No. H05-121700 (Patent Document 1), for example). In this case, since the alignment margin for photolithography is unnecessary, and the gate length of the field effect transistor formed with self aligning can be equal to or smaller than the minimum resolution dimension of the photolithography, a memory cell with design rules finer than a conventional memory cell in which the field effect transistor for selection and the field effect transistor for the memory are respectively formed with a photomask can be achieved.

SUMMARY OF THE INVENTION

The inventors have examined the structure of a memory cell to provide improvements etc. in the rewrite (writing/erasing) endurance and in data retention characteristic of a split-gate type memory cell. However, the rewrite endurance of the split-gate type memory cell includes various technical problems described hereinafter.

When the split-gate type memory cell is held in a write state at a high temperature, the threshold voltage of the memory cell gradually decreases as the holding time passes.

FIG. 44 shows an example of characteristics for holding the memory cell at a high temperature in the write state after the writing was performed in the SSI system and erasing was performed in the BTBT system, resulting in rewriting of 10K times. The horizontal axis of the graph chart of FIG. 44 indicates the time passed in the write state after rewriting was performed 10K times and then the memory cell was turned to the write state, and the vertical axis of the graph charts of FIG. 44 indicates varied amount of the threshold voltage of the memory cell. Conditions for writing and erasing in the memory cell are the same as the one in FIG. 4 described hereinafter. Verification was performed under the conditions for writing and erasing to measure the threshold voltage after a write judgment was configured as 4 volts and an erase judgment was configured as −1.8 volts, rewriting was performed 10K times, and a high temperature was held in the write state. The variation of the threshold voltage was worst when the high temperature was held, and when the threshold voltage was not more than a judgment standard, correct "0" or "1" judgment was impossible.

As shown in FIG. 44, the threshold voltage of the memory cell gradually decreases as the time holding a high temperature passes. Reasons for the variation of the threshold voltage include electrons and holes locally existing in the charge storage layer moving in the transverse direction to be vanished, the recovery of interface states, and the electrons in the charge storage layer detrapped in the silicon substrate.

FIG. 45 shows a relative ratio between the varied amounts of the threshold voltage after each holding voltage was applied to the memory gate electrode and held at a high temperature for 1 hour, and the varied amounts of the threshold voltage after the holding voltage of 0 volts is applied to the memory gate electrode and held at a high temperature for 1 hour. The component accelerated by the holding voltage applied to the memory gate electrode is a component of the detrap mentioned above. As shown in FIG. 45, the relative value of the varied amount of the threshold voltage is the smallest when the holding voltage is +3 volts, and the relative value of approximately 93% is a component that is not accelerated by the holding voltage, that is, the component other than detrap. Therefore, approximately 90% or more of the varied amount of the threshold voltage when the holding voltage is 0 volt is considered to be a component that vanishes by the electrons and the holes locally existing in the charge storage layer moving in the transverse direction.

In addition, when the split-gate type memory cell is held in an erase state at room temperature, the threshold voltage of the memory cell gradually increases as the holding time passes.

FIG. 46 shows an example of characteristics for holding the memory cell at room temperature in the erase state after writing was performed in the SSI system and erasing is performed in the BTBT system, resulting in rewriting of 10K times. The horizontal axis of the graph chart of FIG. 45 indicates the time passed in the erase state after rewriting was performed 10K times and then the memory cell was turned to the erase state, and the vertical axis of the graph charts of FIG. 46 indicates varied amount of the threshold voltage of the memory cell. Conditions for writing and erasing in the memory cell are the same as the one in FIG. 4 described hereinafter. Verification was performed under the conditions for writing and erasing to measure the threshold voltage after the write judgment was configured as 4 volts and the erase judgment was configured as −1.8 volts, rewriting was performed 10K times, and the room temperature was held in the erase state.

As shown in FIG. 46, the threshold voltage of the memory cell gradually increases as the time holding the room temperature passes. One of the reasons for the variation of the threshold voltage is considered to be coupling of the electrons and the holes injected in the charge storage layer after the electrons in the silicon substrate are injected into the charge storage layer via a defect of the oxide film in the silicon substrate side produced by rewriting. Strong acceleration of the electric field on the main surface of the silicon substrate in the vertical direction allows easy injection of the electrons and coupling of the electrons and the holes.

An object of the present invention is to provide a technology for improving data retention characteristics of nonvolatile memories storing an electric charge in an insulator.

The above and other objects and novel characteristics of the present invention will be apparent from the description of this specification and the accompanying drawings.

The typical ones of the inventions disclosed in this application will be briefly described as follows.

A nonvolatile semiconductor device of the present invention comprises: a field effect transistor comprising an insulating film with a laminated structure with a bottom-layer insulating film, a charge storage layer capable of accumulating an electric charge, and a top-layer insulating film formed in turn on the main surface of the semiconductor substrate from the lowest layer, a gate electrode formed on the insulating film, and a source region formed in the semiconductor substrate under one side of the gate electrode, in which an overlapping amount of the charge storage layer and the source region is less than 40 nm.

A method of manufacturing a nonvolatile semiconductor device of the present invention is a method of manufacturing a nonvolatile semiconductor device having a field effect transistor provided with an capability for holding an electric charge, the method comprising the steps of: forming a bottom-layer insulating film, a charge storage layer capable of accumulating an electric charge, and a top-layer insulating film in turn on the main surface of the semiconductor substrate from the lowest layer; forming a gate electrode on the top-layer insulating film; etching a specified amount of the charge storage layer from a side of the gate electrode; forming an impurity region in the semiconductor substrate under one side of the gate electrode by ion-implanting an impurity to the semiconductor substrate using the gate electrode as a mask; and forming a source region by activating the impurity region with heat-treating the semiconductor substrate, in which an overlapping amount of the charge storage layer and the source region is less than 40 nm.

A method of manufacturing a nonvolatile semiconductor device of the present invention is a method of manufacturing a nonvolatile semiconductor device having a field effect transistor provided with an capability for holding an electric charge, the method comprising the steps of: forming a bottom-layer insulating film, a charge storage layer capable of accumulating an electric charge, and a top-layer insulating film in turn on a main surface of the semiconductor substrate from the lowest layer; forming a gate electrode on the top-layer insulating film; forming a sidewall on a side wall of the gate electrode; forming an impurity region in the semiconductor substrate under one side of the gate electrode by ion-implanting an impurity to the semiconductor substrate using the gate electrode and the sidewall as a mask; and forming a source region by activating the impurity region with heat-treating the semiconductor substrate, in which an overlapping amount of the charge storage layer and the source region is less than 40 nm.

The effects obtained by typical aspects of the present invention will be briefly described below.

A nonvolatile memory using a charge accumulation film represented by a MONOS type nonvolatile memory has a smaller variation of the threshold voltage when a high temperature is held in the write state, and a smaller variation of the threshold voltage when the room temperature is held in the erase state, resulting in an improved data retention characteristic.

BRIEF DESCRIPTIONS OF THE DRAWINGS

Figure 45:
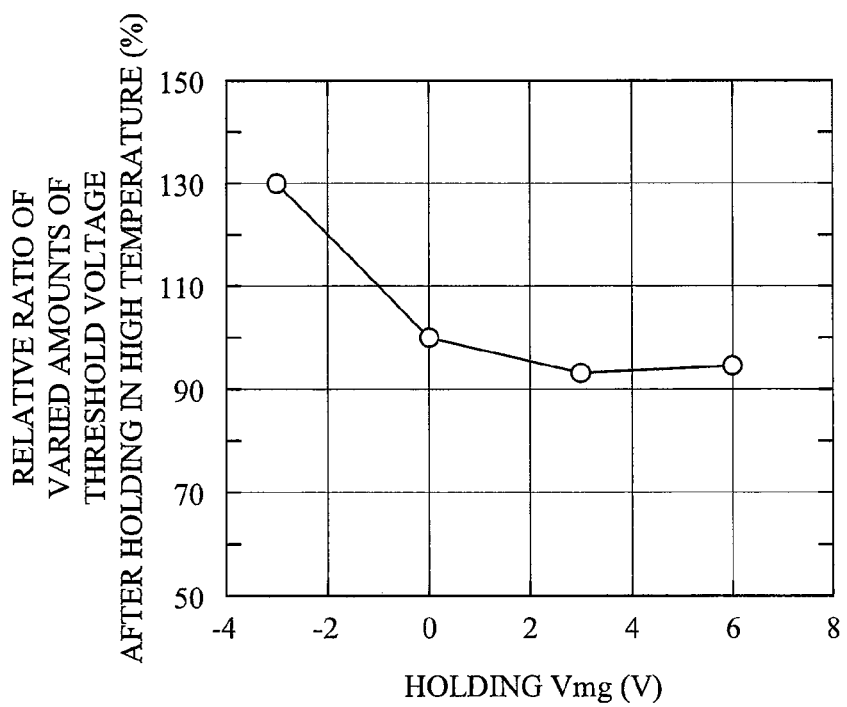
Figure 46:
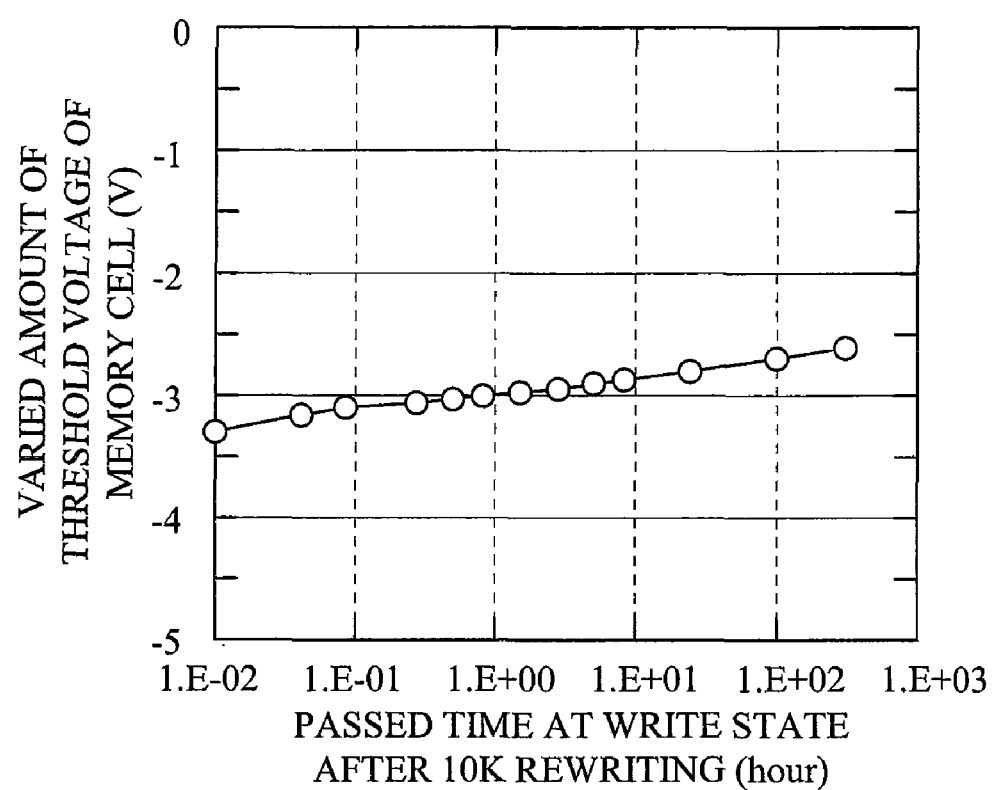

FIG. 45 is a graph chart showing a relative ratio between the varied amounts of the threshold voltage after each holding voltage is applied to the memory gate electrode and held at a high temperature for 1 hour, and the varied amounts of the threshold voltage after the holding voltage of 0 volt is applied to the memory gate electrode and held at a high temperature for 1 hour; and FIG. 46 is a graph chart showing an example of the characteristics for holding at room temperature of the memory cell in the erase state after writing is performed in the SSI system and erasing is performed in the BTBT system, resulting in the rewriting of 10K times.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Further, in the embodiments described below, MIS-FET (Metal Insulator Semiconductor Field Effect Transistor) representing a field-effect transistor is abbreviated as MIS, and an n-channel type MIS-FET is abbreviated as nMIS. MOS-FET (Metal Oxide Semiconductor FET) is a field-effect transistor with a gate insulating film thereof formed of (comprising) a silicon oxide ($SiO_2$ and the like) film, and is contained in the subordinate concept of the MIS. In addition, needless to say, an MONOS type memory cell indicated in this embodiment is also contained in the subordinate concept of the MIS. In addition, silicon nitride in the embodiments includes not only $Si_3N_4$, but also insulating films of similar composition made of nitride of silicon. In addition, a wafer in the embodiments indicate mainly an Si (Silicon) single crystal wafer, as well as an SOI (Silicon On Insulator) wafer, an insulating film substrate for forming an integrated circuit thereon etc. Shapes thereof include not only a circle and a nearly circle, but also a square, a rectangle and the like.

Further, components having the same function are denoted by the same reference symbols throughout the drawings for describing the embodiment, and the repetitive description thereof will be omitted. Hereinafter, embodiments of the present invention will be described in detail with reference to the accompanying drawings.

Embodiment 1

Figure 1:
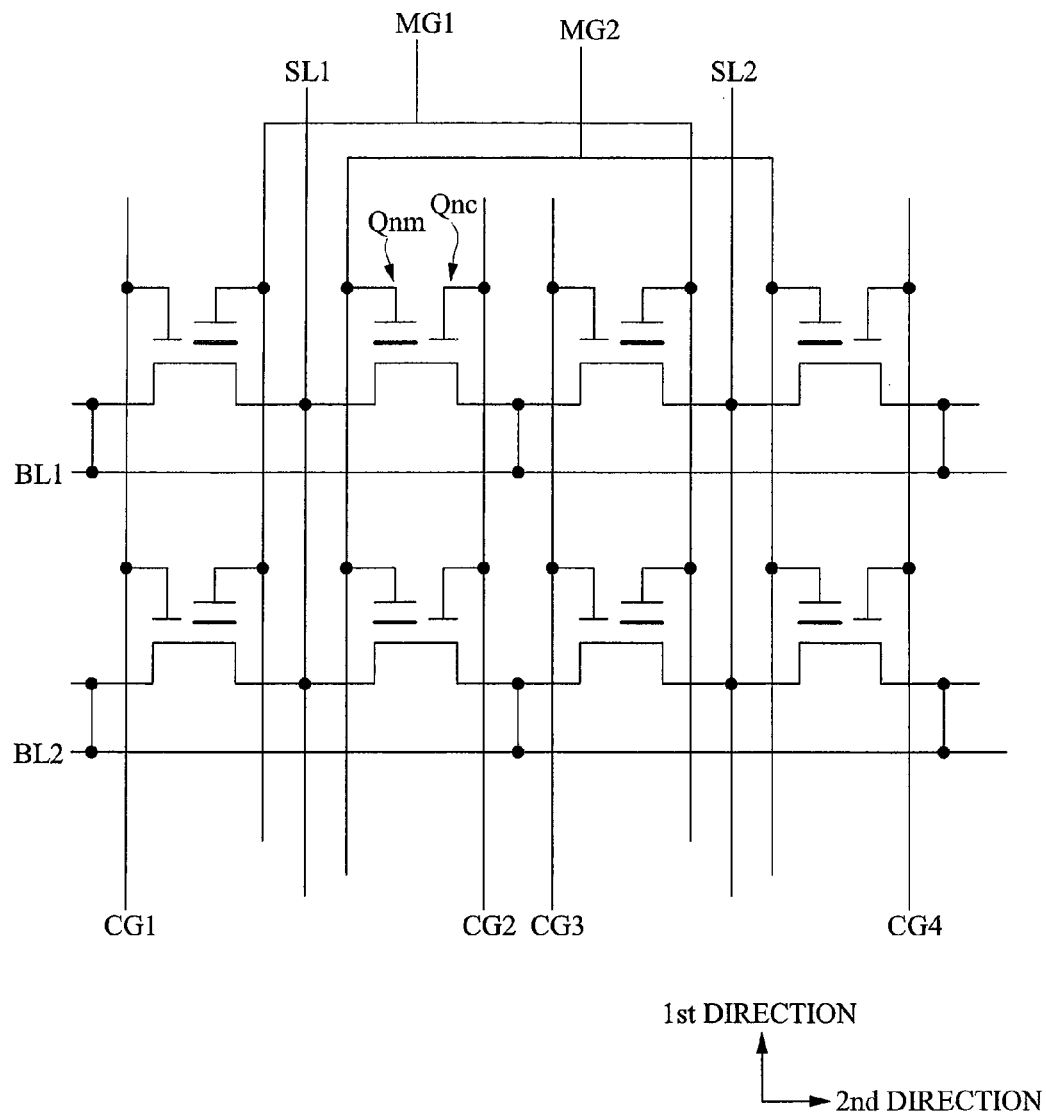
FIG. 1 is an array configuration using a split-gate type MONOS memory cell according to Embodiment 1 of the present invention.
Figure 2:
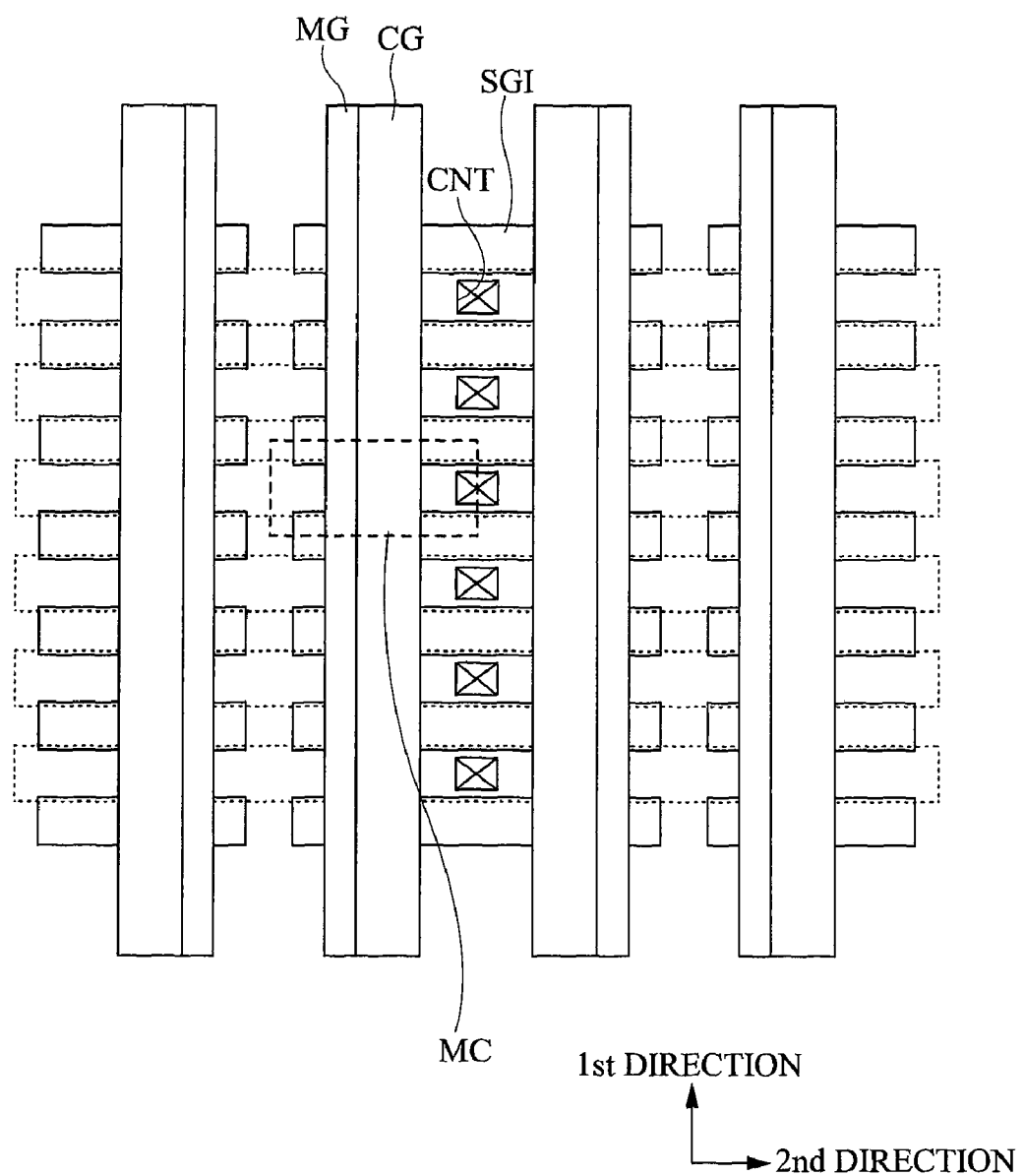
FIG. 2 is a plan view showing a layout of the split-gate type MONOS memory cell according to Embodiment 1 of the present invention.

An example of the structure of a split-gate type MONOS memory cell according to Embodiment 1 will be described with reference to FIGS. 1 to 3. FIG. 1 is an array configuration using the split-gate type MONOS memory cell; FIG. 2 shows a plan view showing a layout of the split-gate type MONOS memory cell; and FIG. 3 is a cross-sectional view of main parts of the memory cell, and a channel is cut in the direction intersecting the memory gate electrode.

As shown in FIGS. 1 and 2, there are two types of word lines including word lines MG1 and MG2 for a memory gate electrode MG of an nMIS (Qnm) for a memory, and word lines CG1, CG2, CG3, and CG4 for a selection gate electrode CG of an nMIS (Qnc) for selection, which are extended in parallel in a first direction. Source lines SL1 and SL2 are extended in the first direction in parallel with the word lines, are adjacent to the memory gate electrode MG of each memory cell, and are connected with the source region shared with the memory cell in opposite. In addition, bit lines BL1 and BL2 are extended in a second direction intersecting the word lines extended in the first direction, and connected with a drain region adjacent to the selection gate electrode CG of each memory cell. A unit memory cell MC is located in the area surrounded by the dotted line in FIG. 2, and is electrically insulated from an adjacent memory cell by a device isolation portion SGI.

Figures 3, 4:
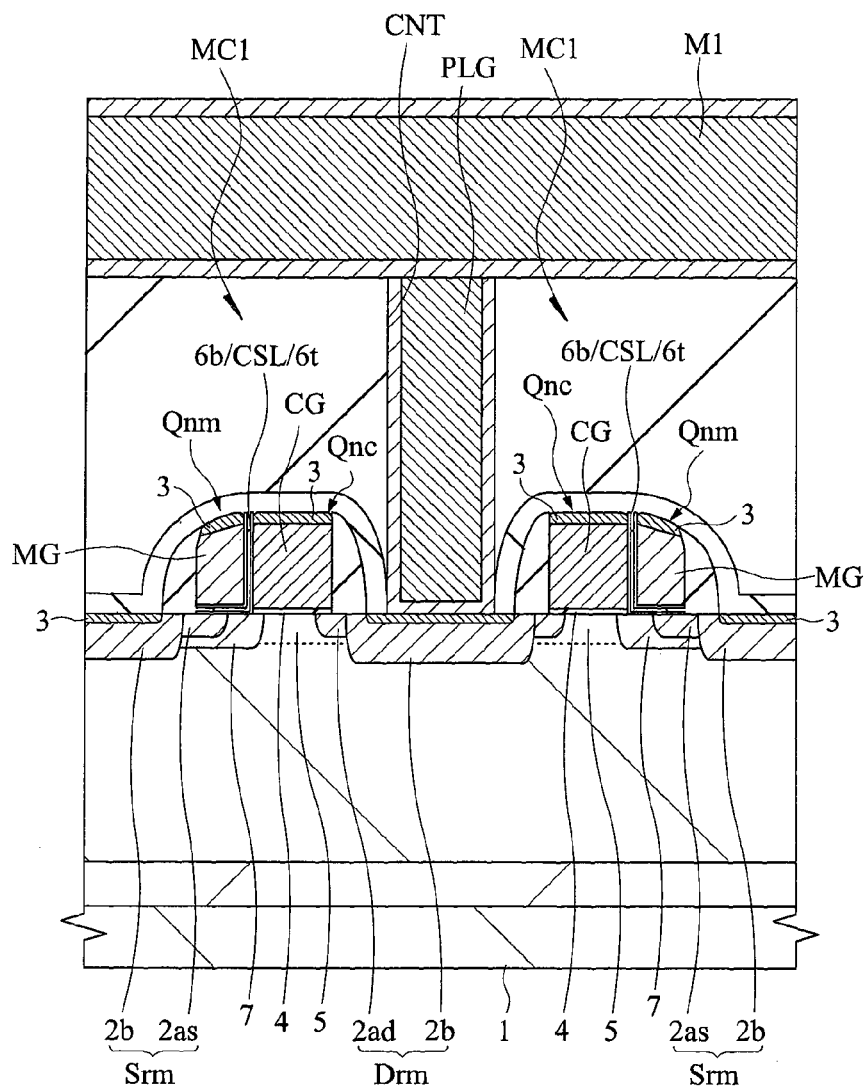
FIG. 3 is a cross-sectional view of main parts of the memory cell of the split-gate type MONOS memory cell according to Embodiment 1 of the present invention, and a channel is cut in the direction intersecting the memory gate electrode.
FIG. 4 is a table summarizing an example of conditions for applying the voltage to each part of the split-gate type MONOS memory cell during write, erase, and read operations according to Embodiment 1 of the present invention.

As shown in FIG. 3, the semiconductor substrate 1 includes, for example, a p-type single crystal silicon, and an nMIS (Qnc) for selection and an nMIS (Qnm) for the memory of a memory cell MC1 according to Embodiment 1 are located in an active region of the main surface (device forming face). A drain region Drm and a source region Srm of this memory cell MC1 have, for example, $n^-$-type semiconductor regions 2ad and 2as with a relatively low concentration, and an $n^+$-type semiconductor region 2b with a relatively high concentration with an impurity concentration higher than the $n^-$-type semiconductor regions 2ad and 2as (LDD (Lightly Doped Drain) structure). The $n^-$-type semiconductor regions 2ad and 2as are located on a channel region side of the memory cell MC1, and the $n^+$-type semiconductor region 2b is located in a position distant from the channel regions side of the memory cell MC1 by the distance of the n⁻-type semiconductor regions 2ad and 2as.

On the main surface of the semiconductor substrate 1 between the drain region Drm and the source region Srm, the selection gate electrode CG of the nMIS (Qnc) for selection and the memory gate electrode MG of the nMIS (Qnm) for the memory are adjacently extended, and in the extending direction, a plurality of memory cells MC1 are adjacent to each other via the device isolation portion SGI formed on the semiconductor substrate 1. The selection gate electrode CG is located in a first area of the main surface of the semiconductor substrate 1, and the memory gate electrode MG is located in a second area different from the first area of the main surface of the semiconductor substrate 1. The selection gate electrode CG is formed of, for example, an n-type polycrystalline silicon film, and the selection gate electrode CG has an impurity concentration of, e.g., approximately $2 \times 10^{20}$ cm$^{-3}$, and has a gate length of, e.g., 100 to 200 nm. The memory gate electrode MG is formed of, e.g., an n-type polycrystalline silicon film and has an impurity concentration of, for example, approximately $2 \times 10^{20}$ cm$^{-3}$ and has a gate length of, e.g., 50 to 150 nm.

On the top surface of the selection gate electrode CG, the memory gate electrode MG, and the n⁺-type semiconductor region 2b constituting a part of the source region Srm and the drain region Drm, a silicide layer 3 such as cobalt silicide, nickel silicide, and titanium silicide, and the like is formed. The MONOS type memory cell needs to supply electric potential to the selection gate electrode CG and the memory gate electrode MG, and an operating speed thereof greatly depends on the resistance of the selection gate electrode CG and the memory gate electrode MG. Therefore, the resistance of the selection gate electrode CG and the memory gate electrode MG is preferably lowered by forming the silicide layer 3. The thickness of the silicide layer 3 is approximately 20 nm, for example.

Between the selection gate electrode CG and the main surfaces of the semiconductor substrate 1, a gate insulating film 4 formed of a thin silicon oxide film with a thickness of approximately 1 to 5 nm is formed. Therefore, the selection gate electrode CG is located on the device isolation portion SGI and on the first area of the semiconductor substrate 1 via the gate insulating film 4. For example, boron is introduced to form a p-type semiconductor region 5 on the main surface of the semiconductor substrate 1 under the gate insulating film 4. The semiconductor region 5 is a semiconductor region for forming a channel of the RMIS (Qnc) for selection, and the semiconductor region 5 configures the threshold voltage of the nMIS (Qnc) for selection to a specified value.

The memory gate electrode MG is provided on one side of the side wall of the selection gate electrode CG, and the insulating film for holding the electric charge (hereinafter described as insulating films 6b, 6t, and a charge storage layer CSL) that is laminated with an insulating film 6b, a charge storage layer CSL, and an insulating film 6t insulates the selection gate electrode CG from the memory gate electrode MG. In addition, the memory gate electrode MG is located on the second area of the semiconductor substrate 1 via the insulating films 6b, 6t, and the charge storage layer CSL. In FIG. 3, the insulating film 6b, 6t, and the charge storage layer CSL is expressed as 6b/CSL/6t.

The charge storage layer CSL is located between the insulating film 6b and 6t in the vertical direction and formed of, e.g., a silicon nitride film and has a thickness of approximately 5 to 20 nm. The silicon nitride film has a discrete trap state in the film, and a capability to accumulate an electric charge in the trap state. The insulating films 6b and 6t include a silicon oxide film and the like. The thickness of the insulating film 6b is from approximately 1 to 10 nm, and the thickness of the insulating film 6t is from approximately 5 to 15 nm. The insulating films 6b and 6t can also be formed with a silicon oxide film including nitrogen.

Furthermore, the charge storage layer CSL that intervenes between the memory gate electrode MG and the semiconductor substrate 1 is formed shorter than the gate length of the memory gate electrode MG or the length of the insulating films 6t and 6b, and the overlapping amount of the charge storage layer CSL and the source region Srm is controlled to be a specified value. The characteristics of the memory cell MC1 described in Embodiment 1 is that the length of the charge storage layer CSL that intervenes between the memory gate electrode MG and the semiconductor substrate 1 is shorter than the gate length of the memory gate electrode MG or the length of the insulating films 6t and 6b, and the overlapping amount of the charge storage layer CSL and the source region Srm is configured to be a specified value. The size and the rewriting (write/erase) characteristics of each of the main parts of the memory cell MC1 including the charge storage layer CSL will be described with reference to FIGS. 7 to 9, and the method of manufacturing the memory cell MC1 including the charge storage layer CSL will be described with reference to FIGS. 10 to 23 in detail.

An n-type semiconductor region 7 is formed with an introduction of, for example, arsenic or phosphorus under the insulating film 6b and on the main surface of the semiconductor substrate 1 between the p-type semiconductor region 5 and the source region Srm. The semiconductor region 7 is a semiconductor region for forming the channel of the nMIS (Qnm) for the memory, and the semiconductor region 7 configures the threshold voltage of the nMIS (Qnm) for the memory to be a specified value. The drain region Drm is connected via a plug PLG embedded in a contact hole CNT with a first layer interconnection M1 extending in the second direction intersecting the memory gate electrode MG (or the selection gate electrode CG) extending in the first direction. This wiring M1 constitutes the bit line BL1 and BL2 of each memory cell MC1.

Next, the write, erase, and read method of the split-gate type MONOS memory cell according to Embodiment 1 will be described with reference to FIGS. 4 to 6.

FIG. 4 shows an example of conditions for applying the voltage to each part of the memory cell MC1 during write, erase, and read operations. FIG. 4 shows a voltage Vd applied to the drain region Drm, a voltage Vcg applied to the selection gate electrode CG, a voltage Vmg applied to the memory gate electrode MG, a voltage Vs applied to the source region Srm, and a voltage Vsub applied to the semiconductor substrate 1 of the memory cell MC1 mentioned above. The voltages shown in FIG. 4 which are examples of application conditions are not limited thereto, and thus modifications are possible if needed. In addition, in Embodiment 1, inject of the electrons to the charge storage layer CSL is defined as "write," and injection of the holes is defined as "erase."

Figure 5:
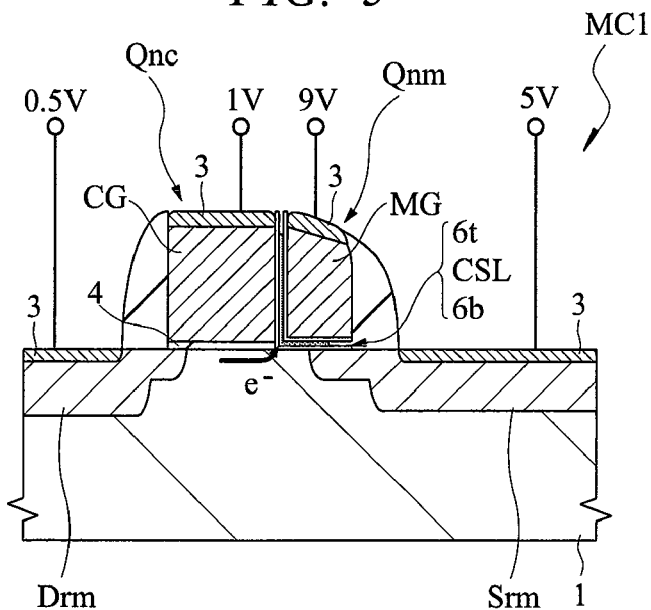
FIG. 5 is a cross-sectional view of main parts of the split-gate type MONOS memory cell for describing the write operation according to Embodiment 1 of the present invention.

FIG. 5 shows a cross-sectional view of main parts of the memory cell MC1 for describing the write operation. The source side injecting system of the electron (hot electron) called the SSI system can be used as a write method. For example, each voltage shown in FIG. 4 is applied to each part of the memory cell MC1 to inject the electrons into the charge storage layer CSL of the memory cell MC1. The electrons are generated in the channel region (between the source region Srm and the drain regions Drm) under in between the two gate electrodes (the memory gate electrode MG and the selection gate electrode CG), and the electrons are locally injected in an area on the nMIS (Qnc) for selection side of the charge storage layer CSL under the memory gate electrode MG. The injected electrons are discretely captured by the trap of the charge storage layer CSL, resulting in a higher threshold voltage of the nMIS (Qnm) for the memory.

Figure 6:
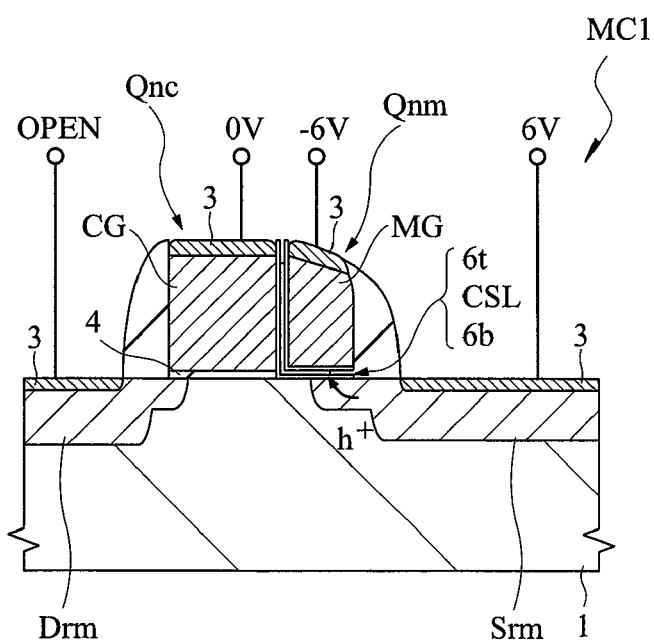
FIG. 6 is a cross-sectional view of main parts of the split-gate type MONOS memory cell for describing the erase operation according to Embodiment 1 of the present invention.

FIG. 6 shows a cross-sectional view of main parts of the memory cell MC1 for describing the erasing operation. The BTBT system can be used as the erasing method. For example, each voltage shown in FIG. 4 is applied to each part of the memory cell MC1 to electrically accelerating the holes generated by the interband tunneling phenomenon for injecting and erasing into the charge storage layer CSL. This lowers the threshold voltage of the nMIS (Qnm) for the memory.

When reading, for example, the voltages shown in the "Read" column of FIG. 4 are applied to each part of the memory cell MC1 that performs a read operation. The current flowing in the drain region Drm is measured with the voltage Vmg applied to the memory gate electrode MG when reading as a value between the threshold voltage of the nMIS (Qnm) for the memory in the write state and the threshold voltage of the nMIS (Qnm) for the memory in the erase state to distinguish the write state from the erase state by the size of the current.

Figure 7:
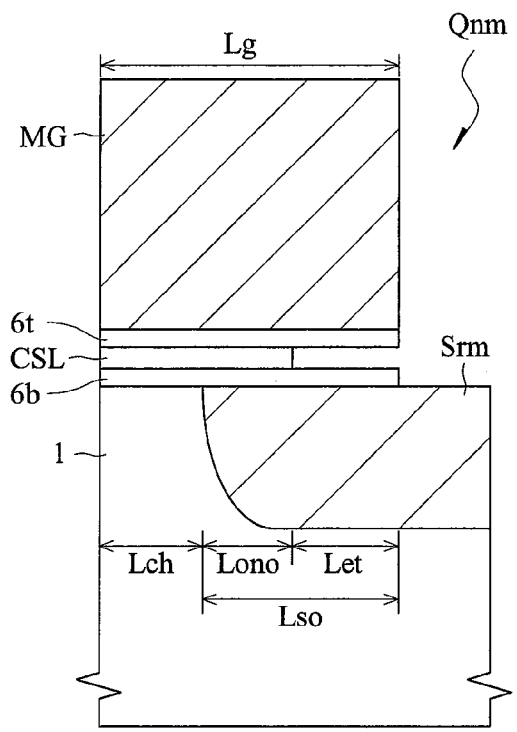
FIG. 7 is a cross-sectional view of main parts showing an enlarged part of the split-gate type MONOS memory cell according to Embodiment 1 of the present invention.
Figure 8:
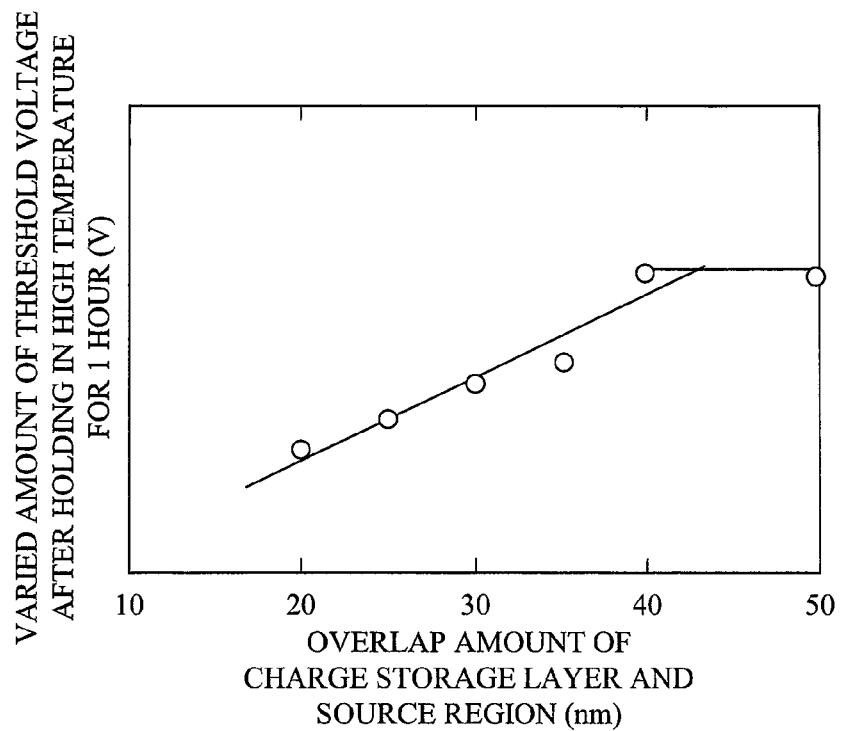
FIG. 8 is a graph chart showing the characteristics for holding at a high temperature of the split-gate type MONOS memory cell in the writing state after rewriting 10K times according to Embodiment 1 of the present invention.
Figure 9:
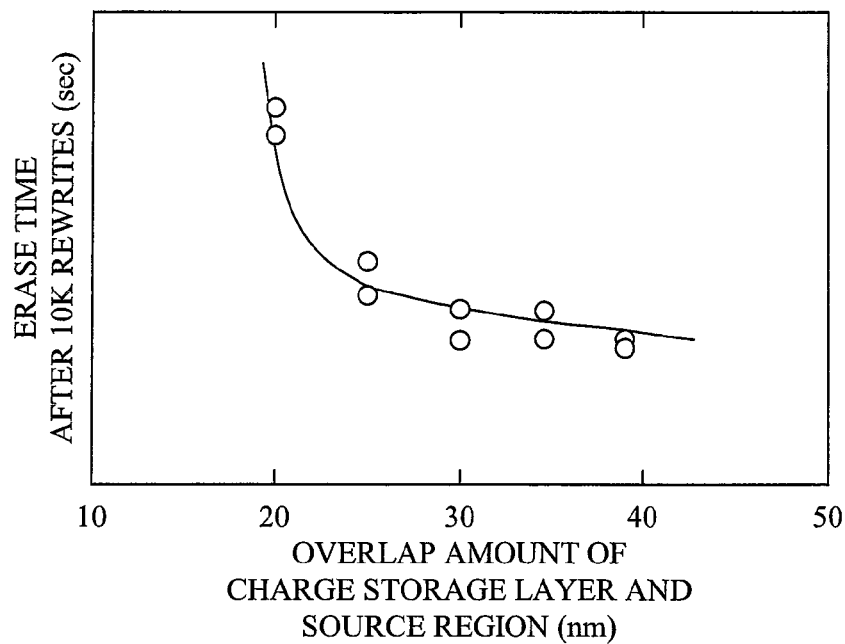
FIG. 9 is a graph chart showing the characteristics for erasing at room temperature of the split-gate type MONOS memory cell after rewriting 10K times according to Embodiment 1 of the present invention.

Next, the size and the rewriting (write/erase) characteristics of each of the main part of the split-gate type MONOS memory cell MC1 according to Embodiment 1 will be described with reference to FIGS. 7 to 9 in detail. FIG. 7 is a cross-sectional view of main parts showing an enlarged part of the memory cell; FIG. 8 is graph chart showing the characteristics for holding at a high temperature of the memory cell in the writing state after rewriting 10K times; and FIG. 9 is graph chart showing the characteristics for erasing at room temperature of the memory cell after rewriting 10K times.

The split-gate type MONOS memory cell according to Embodiment 1 is different from the conventional split-gate type MONOS memory cell in that the charge storage layer CSL that intervenes between the memory gate electrode MG and the semiconductor substrate 1 of the nMIS (Qnm) for the memory is formed shorter than the gate length of the memory gate electrode MG or the length of the insulating films 6t and 6b to control the overlapping amount of the charge storage layer CSL and the source region Srm to a specified value. The variation of the threshold voltage when a high temperature is held in the write state is considered to be caused mainly by the electrons and holes that locally exist in the charge storage layer CSL moving in the transverse direction to be vanished, and can be reduced by reducing the holes that are accumulated in the charge storage layer CSL on the source region Srm and that are produced by repeating rewriting operations. Therefore, forming a shorter charge storage layer CSL reduces the overlapping amount of the source region Srm and charge storage layer CSL, resulting in smaller variations of the threshold voltage.

As shown in FIG. 7, the insulating film 6t, 6b, and the charge storage layer CSL intervenes between the memory gate electrode MG and the semiconductor substrate 1 of the nMIS (Qnm) for the memory. The charge storage layer CSL overlaps with the charge storage layer CSL and the source region Srm formed in the semiconductor substrate 1, but it is formed shorter than the gate length (Lg) of the memory gate electrode MG and the insulating films 6t and 6b. The overlapping amount (Lono) is, for example, determined by an etching amount of the charge storage layer CSL (Let), and a concentration profile of an n⁻-type semiconductor region 2as constituting a part of the source region Srm, and the like. However, since the shape of the n⁻-type semiconductor region 2as also affects operating characteristics of the memory cell MC1 other than the data retention characteristic, configuration of forming conditions for the n⁻-type semiconductor region 2as is difficult only to maintain the data retention characteristic; therefore, the overlapping amount (Lono) is mainly controlled by the etching amount (Let) of the charge storage layer CSL.

FIG. 8 shows the relation between the varied amount of the threshold voltage of the memory cell, and the overlapping amount of the charge storage layer and the source region when a high temperature is held in the write state for 1 hour after rewriting 10K times. Rewriting of 10K times is performed according to the writing and erasing conditions shown in FIG. 4. The overlapping amount of the charge storage layer and the source region is adjusted with the etching amount of the charge storage layer. For example, after processing with mixed acid OJ (HF:NH$_4$F:CH$_3$COOH=2.1%:28.6%:23.6%) for 10 seconds, and with mixed acid (fluoric acid:nitric acid=1:200) for 5 seconds, the sample with platinum vapor-deposited is observed with the SEM (Scanning Electron Microscope) to measure the overlapping amount of the charge storage layer and the source region.

As shown in FIG. 8, when the overlapping amount of the charge storage layer and the source region is less than 40 nm, the varied amount of the threshold voltage becomes smaller as the overlapping amount becomes smaller. The reason for this is considered to be that when the overlapping amount becomes smaller, the increase of the inject holes to the charge storage layer CSL gradually decreases, and the movement in the transverse direction of the electrons and the holes locally existing in the charge storage layer CSL decreases. When the overlapping amount of the charge storage layer and the source region is 40 nm or more, since the holes do not reach the source region Srm in the BTBT system, the variation of the threshold voltage is very small.

FIG. 9 shows a relation of an erasing time before the threshold voltage reaches an erase judgment voltage (−1.8 volts) at room temperature after rewriting 10K times, and the overlapping amount of the charge storage layer and the source region. Rewriting of 10K times is performed according to the writing and erasing conditions shown in FIG. 4, and manufacturing and measuring methods, etc. of the sample are the same as indicated in the description of FIG. 8.

As shown in FIG. 9, as the overlapping amount of the charge storage layer and the source region becomes smaller, the erasing time becomes longer, and when the overlapping amount becomes smaller than 25 nm, the erasing time suddenly becomes long.

The variation of the threshold voltage of the memory cell when holding at a high temperature in the write state shown in FIG. 8 and the erasing time at room temperature of the memory cell after rewriting 10K times shown in the FIG. 9 indicate that the overlapping amount of the charge storage layer CSL and the source region Srm less than 40 nm, for example, is considered to be appropriate (the range is not limited thereto depending on other conditions). The range suitable for mass production is from 10 to 30 nm, and the range with 25 nm as a center value is considered to be most suitable. For example, a memory cell MC1 can be constituted to be 80 nm in the gate length (Lg) of the memory gate electrode MG, 50 nm in the overlapping amount (Lso) of the memory gate electrode MG and the source region Srm, 30 nm in the effective channel length (Lch) of the memory gate electrode MG, 20 to 40 nm in the etching amount (Let) of the charge storage layer CSL, and 10 to 30 nm in the overlapping amount (Lono) of the charge storage layer CSL and the source region Srm.

Next, an example of the method of manufacturing the split-gate type MONOS memory cell according to Embodiment 1 will be described with reference to FIGS. 10 to 23. FIGS. 10 to 16 and FIGS. 18 to 23 are the cross-sectional view of main parts of the memory cell during the manufacturing process of the semiconductor device, showing the same part as the cross-sectional view of main parts of the memory cell shown in the FIG. 3, and FIG. 17 is a graph chart showing the relation between the etching amount of the charge storage layer, and the etching time.

First, for example, a semiconductor substrate 1 consisting of a p-type single crystal silicon (a thin flat board in an approximate circle shape of a semiconductor called a semiconductor wafer in this stage) having a resistivity of approximately 1 to 10 Ω.cm is prepared. Next, on the main surface of the semiconductor substrate 1, a trench shaped device isolation portion SGI, the active region located to be surrounded thereby, and the like are formed. That is, after forming an isolation trench in a specified position of the semiconductor substrate 1, an insulating film consisting, for example, of a silicon oxide film is deposited on the main surface of the semiconductor substrate 1, and the insulating film is polished by the CMP (Chemical Mechanical Polishing) method and the like to leave the insulating film only in the isolation trench to form a device isolation portion SGI.

Figure 10:
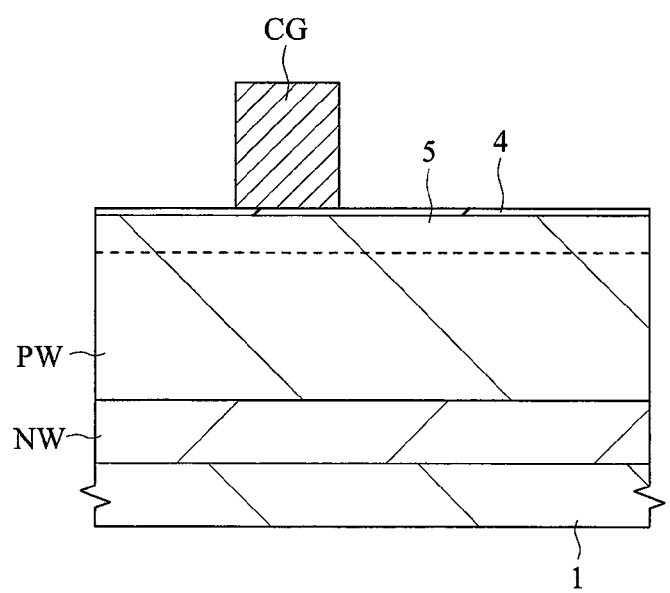
FIG. 10 is a cross-sectional view of main parts of the split-gate type MONOS memory cell during the manufacturing process according to Embodiment 1 of the present invention.

Next, as shown in FIG. 10, a specified impurity is selectively introduced to a specified part of the semiconductor substrate 1 with a specified energy by ion-implant method and the like to form embedded n-well NW and p-well PW. Next, a p-type impurity such as boron is ion-implanted to the main surface of the semiconductor substrate 1 to form the p-type semiconductor region 5 for forming the channel of the nMIS (Qnc) for selection. The implanting energy of the p-type impurity ion in this process is approximately 20 keV and the dose is approximately $1.5 \times 10^{13}$ cm$^{-2}$, for example.

Next, by performing an oxidation treatment to the semiconductor substrate 1, the gate insulating film 4 with a thickness of 1 to 5 nm formed of, e.g., a silicon oxide film is formed on the main surface of the semiconductor substrate 1. Next, a first conductor film formed of a polycrystalline silicon film having an impurity concentration of approximately $2 \times 10^{20}$ cm$^{-3}$ is deposited on the main surface of the semiconductor substrate 1. The first conductor film is formed by the CVD (Chemical Vapor Deposition) method, and has a thickness of approximately 150 to 250 nm, for example. Next, the first conductor film is processed by using a resist pattern as a mask to form the selection gate electrode CG. The gate length of the selection gate electrode CG is approximately 100 to 200 nm, for example.

Figure 11:
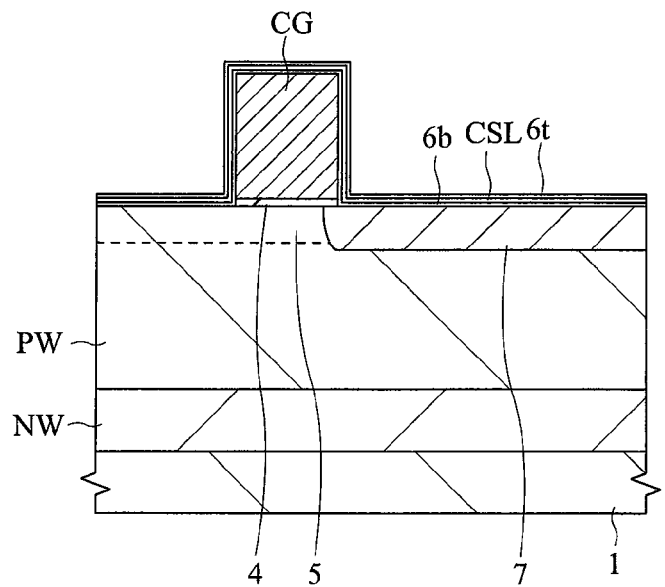
FIG. 11 is a cross-sectional view of main parts of the memory cell shown in FIG. 10 during the manufacturing process after the process of FIG. 10.

Next, as shown in FIG. 11, ion-implanting an n-type impurity, such as arsenic and phosphorus, to the main surface of the semiconductor substrate 1 using the selection gate electrode CG and the resist pattern as a mask to form an n-type semiconductor region 7 for forming the channel of the nMIS for the memory. The implanting energy of the n-type impurity ion in this process is approximately 25 keV and the dose is approximately $6.5 \times 10^{12}$ cm$^{-2}$, for example.

Next, the insulating film 6b formed of a silicon oxide film, the charge storage layer CSL formed of a silicon nitride film, and the insulating film 6t formed of a silicon oxide film are deposited in turn on the main surface of the semiconductor substrate 1, for example. The insulating film 6b is formed by the thermal oxidation method, and has a thickness of approximately 1 to 10 nm, the charge storage layer CSL is formed by the CVD method, and has a thickness of approximately 5 to 20 nm, and the insulating film 6t is formed by the CVD method, and has a thickness of 5 to 15 nm, for example.

Therefore, the thicknesses of the insulating films 6b, 6t, and the charge storage layer CSL are approximately 11 to 45 nm, for example. The insulating films 6b, 6t, and the charge storage layer CSL function as a gate insulating film of the nMIS (Qnm) for the memory to be formed later in addition to having a capability for holding an electric charge. In addition, the insulating films 6b, 6t, and the charge storage layer CSL have characteristics that the potential barrier height of the middle layer is low compared to the potential barrier height of the lower and upper layers.

The insulating film 6t can be formed by thermally oxidizing an upper part of the charge storage layer CSL, for example, and a high withstand voltage film can be formed. In this case, the thickness of the deposited film of the charge storage layer CSL only has to be greater than the above-mentioned value. In addition, although the insulating film 6t can be formed only by the thermal oxidation of the upper part of the charge storage layer CSL, the growth rate of the insulating film 6t (growth rate of a silicon oxide film obtained by thermal oxidation of a silicon nitride film) is relatively slow; therefore, after depositing a silicon oxide film with a thickness of approximately 6 nm on the charge storage layer CSL, approximately 1 nm of the upper layer of the charge storage layer CSL can be oxidized to form an insulating film 6t with the total thickness of 7 nm. Thus, the high withstand voltage film can also be formed.

The configurations of each film (insulating film 6b, charge storage layer CSL, and insulating film 6t) constituting the insulating films 6b, 6t, and the charge storage layer CSL change depending on usage of the semiconductor device to manufacture, only typical configurations and values are shown herein, and the above-mentioned configurations and values are not limitative.

Figure 12:
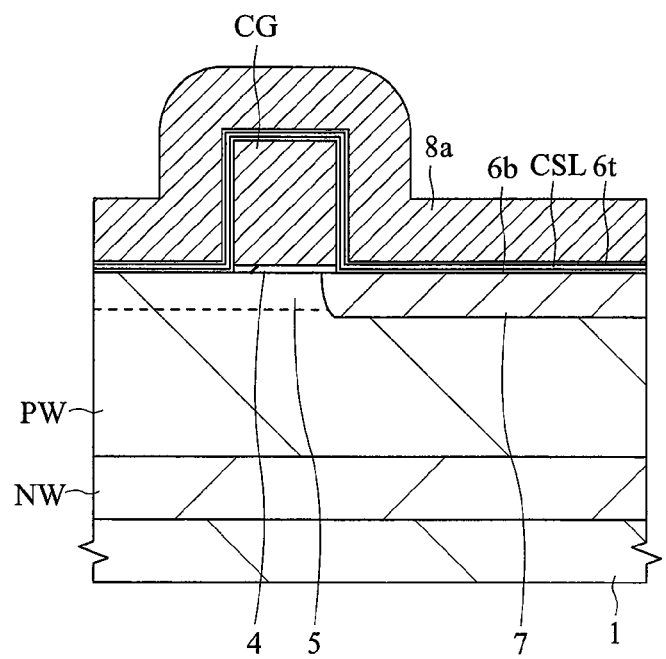
FIG. 12 is a cross-sectional view of main parts of the memory cell shown in FIG. 10 during the manufacturing process after the process of FIG. 11.

Next, as shown in FIG. 12, a second conductor film 8a formed of a polycrystalline silicon film having an impurity concentration of approximately $2 \times 10^{20}$ cm$^{-3}$ is deposited on the main surface of the semiconductor substrate 1. The second conductor film 8a is formed by the CVD method, and has a thickness of approximately 50 to 150 nm, for example.

Figure 13:
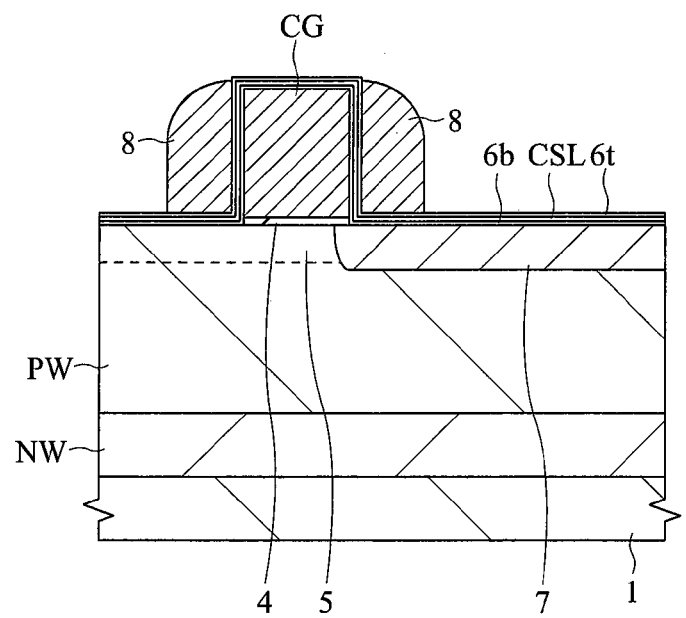
FIG. 13 is a cross-sectional view of main parts of the memory cell shown in FIG. 10 during the manufacturing process after the process of FIG. 12.

Next, as shown in FIG. 13, by etching back the second conductor film 8a with an anisotropic dry etching method, sidewalls 8 are formed on both side surfaces of the selection gate electrode CG via the insulating films 6b, 6t, and the charge storage layer CSL. Although no shown, the second conductor film 8a is processed by using a resist pattern as a mask, and a drawing part is formed in an area to form a contact hole to be connected with the memory gate electrode later. In addition, in the process of forming the sidewall 8, the second conductor film 8a is etched back with the insulating film 6t as an etching stopper layer, but etching conditions with a low damage is preferably configured to prevent the insulating film 6t and the charge storage layer CSL thereunder from being damaged by the etch back. Damage to the insulating film 3t and the charge storage layer CSL will deteriorate characteristics of the memory cell such as charge storage characteristics.

Figure 14:
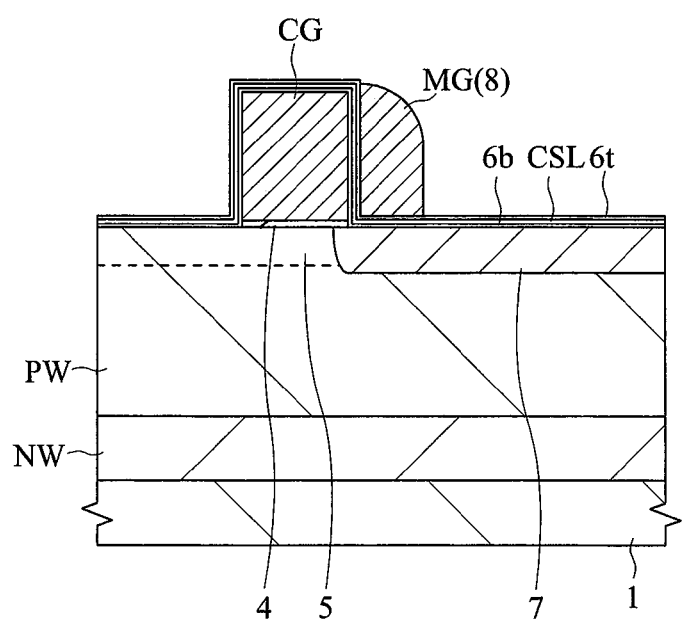
FIG. 14 is a cross-sectional view of main parts of the memory cell shown in FIG. 10 during the manufacturing process after the process of FIG. 13.

Next, as shown in FIG. 14, with a resist pattern as a mask, the sidewall 8 exposed therefrom is etched to form the memory gate electrode MG including the sidewall 8 on one of the side walls of the selection gate electrode CG. The gate length of the memory gate electrode MG is approximately 50 to 150 nm, for example.

Since the gate length of the memory gate electrode MG can be determined by the thickness of the deposited film of the second conductor film 8a, the gate length of the memory gate electrode MG is adjusted by adjusting the thickness of the deposited film of the second conductor film 8a. The gate length of the memory gate electrode MG can be shorter by making the thickness of the deposited film of the second conductor film 8a smaller, and the gate length of the memory gate electrode MG can be longer by making the thickness of the deposited film of the second conductor film 8a greater, for example. The thickness of the deposited film of the second conductor film 8a is preferably approximately 50 to 150 nm due to channel control characteristics and writing/erasing characteristics of the memory cell MC1 having a relation of trade-off. Furthermore, when the gate length of the selection gate electrode CG is approximately 200 nm, the thickness of the deposited film of the second conductor film 8a is preferably about 50 to 100 nm. Thereby, the gate length of the memory gate electrode MG can be approximately 50 to 100 nm.

Figure 15:
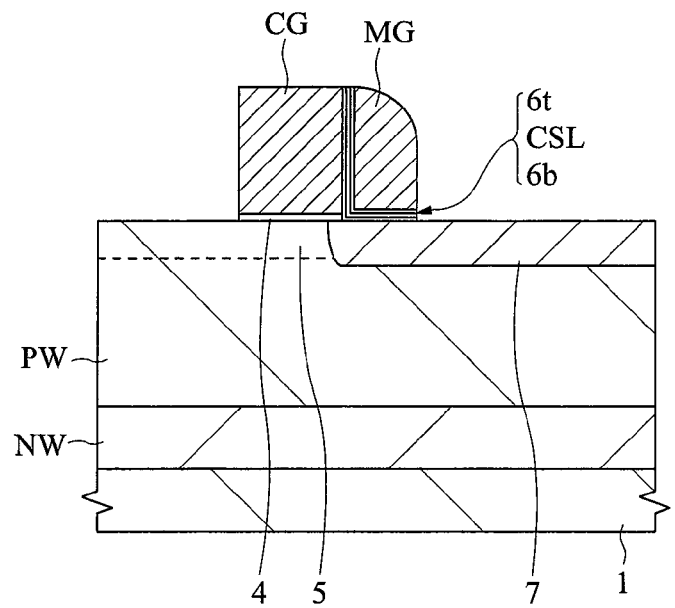
FIG. 15 is a cross-sectional view of main parts of the memory cell shown in FIG. 10 during the manufacturing process after the process of FIG. 14.

Next, as shown in FIG. 15, leaving a part of the insulating films 6b, 6t, and the charge storage layer CSL between the selection gate electrode CG and the memory gate electrode MG, and between the semiconductor substrate 1 and the memory gate electrode MG, the insulating films 6b, 6t, and the charge storage layer CSL in the other area are selectively etched.

Figure 16:
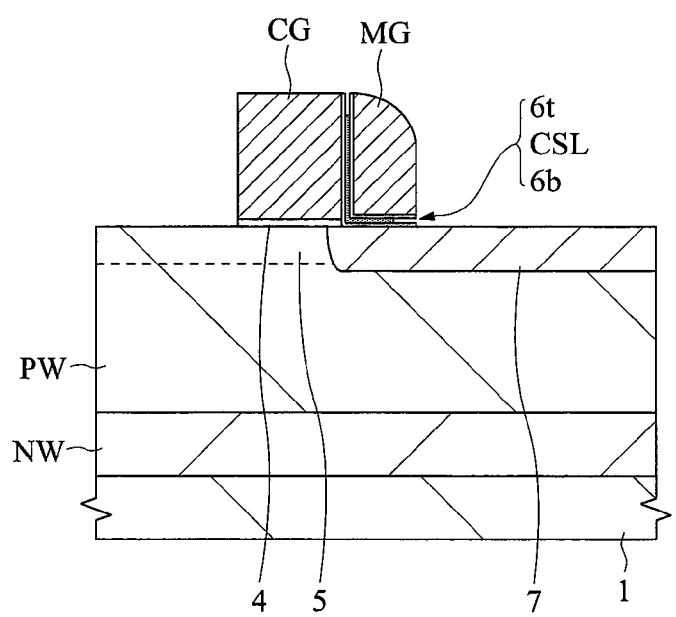
FIG. 16 is a cross-sectional view of main parts of the memory cell shown in FIG. 10 during the manufacturing process after the process of FIG. 15.
Figure 17:
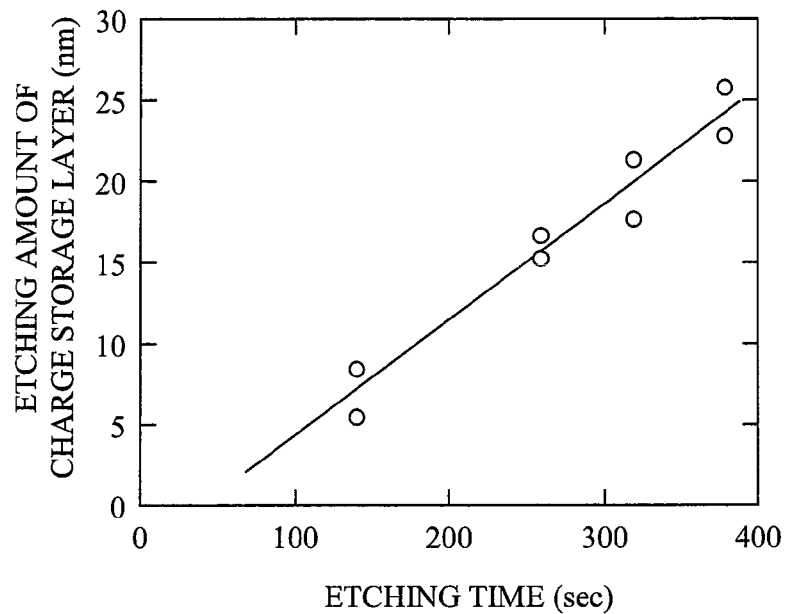
FIG. 17 is a graph chart showing the relation between the etching amount of the charge storage layer and the etching time according to Embodiment 1 of the present invention.

Next, as shown in FIG. 16, the charge storage layer CSL is side etched with an isotropic wet etching method to adjust the overlapping amount of the charge storage layer CSL and a source region. For example, the charge storage layer CSL can be etched using heated phosphoric acid of approximately 160° C., and the etching amount is controlled by the etching time. FIG. 17 shows the relation between the etching amount of the charge storage layer (silicon nitride film) and the etching time. FIG. 17 indicates that the etching amount is proportional to the etching time, and therefore, the etching amount of the charge storage layer can be controlled by the etching time.

Figure 18:
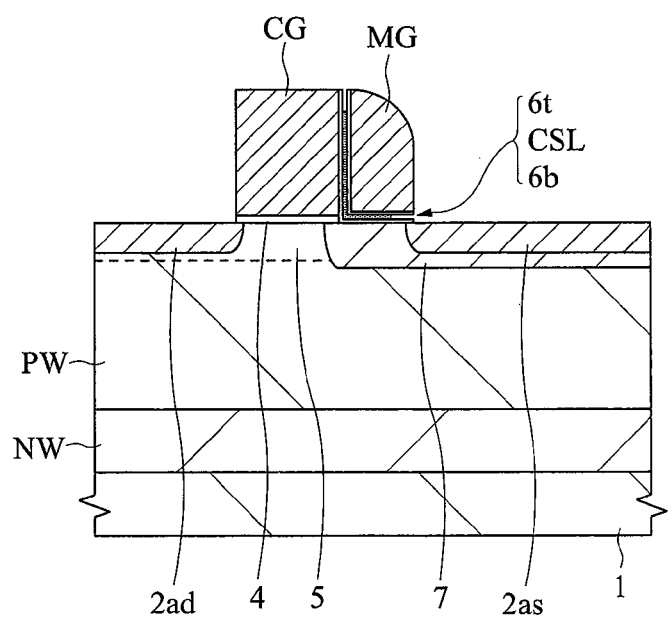
FIG. 18 is a cross-sectional view of main parts of the memory cell shown in FIG. 10 during the manufacturing process after the process of FIG. 16.

Next, as shown in FIG. 18, after forming a resist pattern having an end thereof located on the top surface of the selection gate electrode CG and covering a part of the selection gate electrode CG on the opposite side of the memory gate electrode MG, an n-type impurity such as arsenic is ion-implanted to the main surface of the semiconductor substrate 1 using the selection gate electrode CG, the memory gate electrode MG, and the resist pattern as a mask to form the n$^-$-type semiconductor region 2as on the main surface of the semiconductor substrate 1 in a self alignment manner to the memory gate electrode MG. The implanting energy of the impurity ion in this process is approximately 5 keV and the dose is approximately $1\times10^{15}$ cm$^{-2}$, for example.

Next, after forming a resist pattern having an end thereof located on the top surface of the selection gate electrode CG and covering a part of the selection gate electrode CG on the memory gate electrode MG side and the memory gate electrode MG, an n-type impurity such as arsenic is ion-implanted to the main surface of the semiconductor substrate 1 using the selection gate electrode CG, the memory gate electrode MG, and the resist pattern as a mask to form the n$^-$-type semiconductor region 2ad on the main surface of the semiconductor substrate 1 in a self alignment manner to the selection gate electrode CG. The implanting energy of the n-type impurity ion in this process is approximately 7 keV and the dose is approximately $1\times10^{15}$ cm$^{-2}$, for example.

The n$^-$-type semiconductor region 2as was formed first, and then the n$^-$-type semiconductor region 2ad was formed herein, but the n$^-$-type semiconductor region 2ad can be formed first, and then the n$^-$-type semiconductor region 2as can be formed. In addition, the n$^-$-type semiconductor regions 2as and 2ad can be formed simultaneously. In addition, after ion-implant of the n-type impurity to form the n$^-$-type semiconductor region 2ad, a p-type impurity such as boron can be ion-implanted to the main surface of the semiconductor substrate 1 to form the p-type semiconductor region to surround the lower part of the n$^-$-type semiconductor regions 2as and 2ad. The implanting energy of the p-type impurity ion is approximately 20 keV and the dose is approximately $2.5\times10^{13}$ cm$^{-2}$, for example.

The memory cell MC1 according to Embodiment 1 generates holes using, what is called, the interband tunneling phenomenon in an end of the n$^-$-type semiconductor region 2as when erasing. The efficiency for producing holes with this phenomenon depends on the impurity concentration (charge density of the impurity) on the n$^-$-type semiconductor region 2as side, and a certain impurity concentration is suitable for generation of the holes. Therefore, when forming the n$^-$-type semiconductor region 2as, phosphorus of $1\times10^{13}$ to $1\times10^{14}$ cm$^{-2}$ in dose as well as arsenic is ion-implanted to form an impurity concentration region suitable for generation of holes on the side (end) of the impurity region formed with arsenic. That is, when arsenic and phosphorus are ion-implanted, phosphorus diffuses more easily than arsenic in the transverse direction (direction parallel to the main surface of the semiconductor substrate 1); therefore, an area with a low impurity concentration is formed in the end of the n$^-$-type semiconductor region 2as. Thereby, holes can be efficiently generated.

Figure 19:
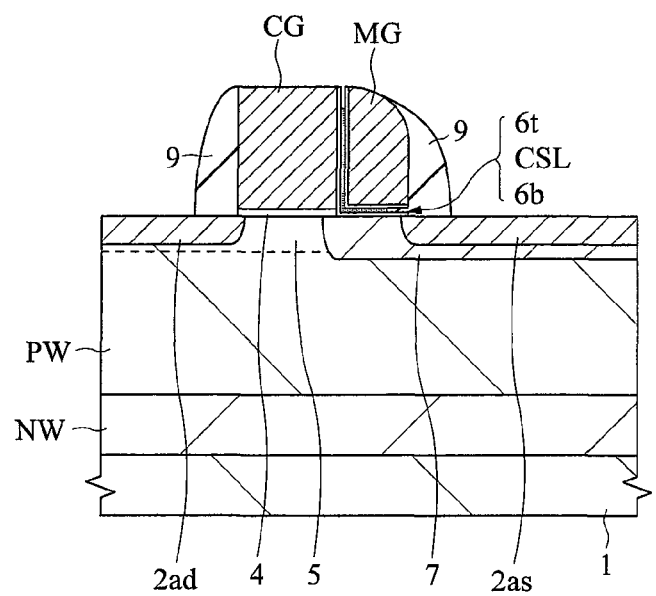
FIG. 19 is a cross-sectional view of main parts of the memory cell shown in FIG. 10 during the manufacturing process after the process of FIG. 18.

Next, as shown in FIG. 19, after depositing an insulating film with a thickness of approximately 80 nm formed of, e.g., a silicon oxide film with the plasma CVD method on the main surface of the semiconductor substrate 1, the obtained insulating film is etched back with an anisotropic dry etching method to form sidewalls 9 on one side of the selection gate electrode CG and on one side of the memory gate electrode MG. The spacer length of the sidewalls 9 is approximately 60 nm, for example. Thereby, the exposed side of the gate insulating film 6 between the selection gate electrode CG and the semiconductor substrate 1, and the exposed side of the insulating films 6b, 6t, and the charge storage layer CSL between the memory gate electrode MG and the semiconductor substrate 1 can be covered by sidewalls 9.

Figure 20:
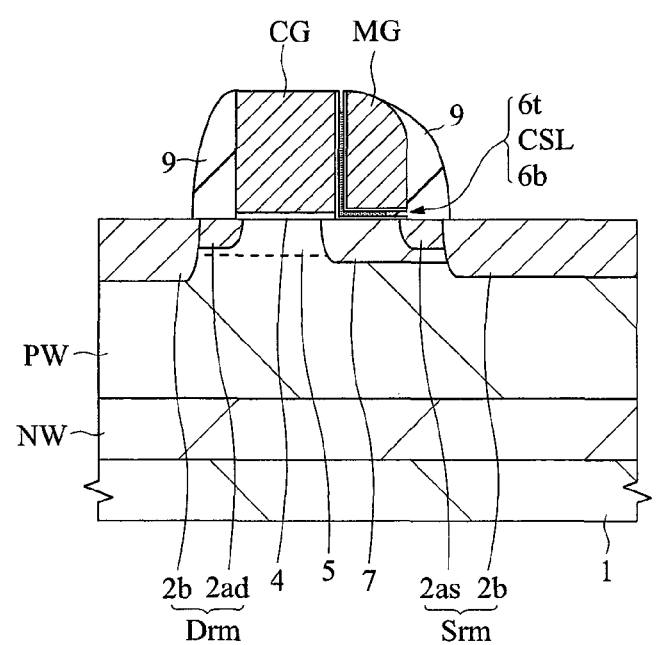
FIG. 20 is a cross-sectional view of main parts of the memory cell shown in FIG. 10 during the manufacturing process after the process of FIG. 19.

Next, as shown in FIG. 20, an n-type impurity such as arsenic and phosphorus is ion-implanted to the main surface of the semiconductor substrate 1 by using the sidewalls 9 as a mask to form the n$^+$-type semiconductor region 2b on the main surface of the semiconductor substrate 1 in a self alignment manner to the selection gate electrode CG and the memory gate electrode MG. The implanting energy of the n-type impurity ion in this process is approximately 50 keV and the dose is approximately $4\times10^{15}$ cm$^{-2}$, for example, and the implanting energy of phosphorous ion is approximately 40 keV and the dose is approximately $5\times10^{13}$ cm$^{-2}$, for example. Thereby, the drain region Drm including the n$^-$-type semiconductor region 2ad and the n$^+$-type semiconductor region 2b, and the source region Srm including the n$^-$-type semiconductor region 2as and the n$^+$-type semiconductor region 2b are formed.

Figure 21:
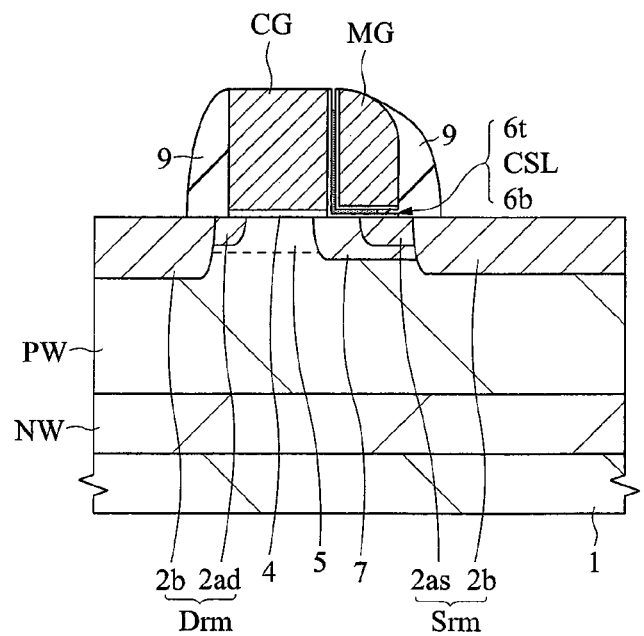
FIG. 21 is a cross-sectional view of main parts of the memory cell shown in FIG. 10 during the manufacturing process after the process of FIG. 20.

Next, as shown in FIG. 21, the semiconductor substrate 1 is heat-treated to extend the source region Srm to the area under the memory gate electrode MG to determine the overlapping amount of the charge storage layer CSL and the source region Srm. For example, spike annealing at 1,000° C. to the semiconductor substrate 1 for 10 seconds can extend the source region Srm by approximately 50 nm.

Figure 22:
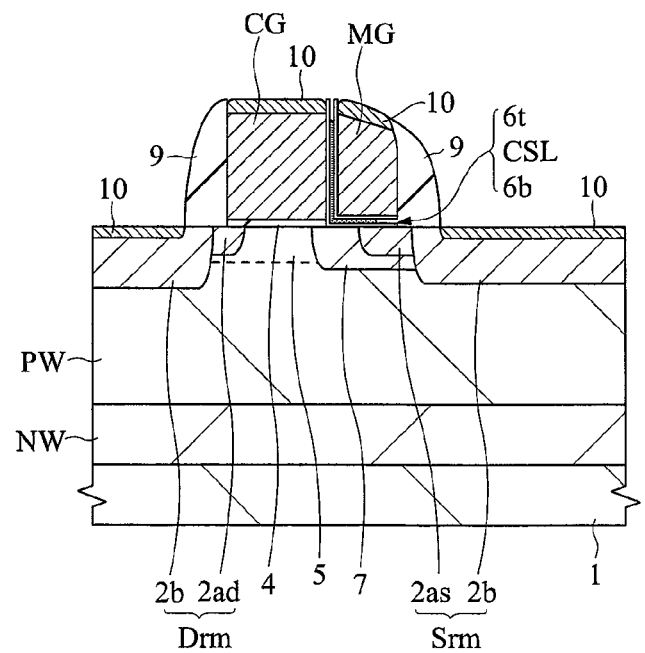
FIG. 22 is a cross-sectional view of main parts of the memory cell shown in FIG. 10 during the manufacturing process after the process of FIG. 21.

Next, as shown in FIG. 22, a cobalt silicide (CoSi$_2$) layer 10 is formed in a self alignment manner, such as with the Salicide (Salicide: Self Align silicide) process on the top surface of the selection gate electrode CG and the memory gate electrode MG, and on the top surface of the n+-type semiconductor region 2b. First, a cobalt film is deposited by the sputtering method on the main surface of the semiconductor substrate 1. Next, by performing heat treatment using the RTA (Rapid Thermal Annealing) method to the semiconductor substrate 1, the cobalt film and the polycrystalline silicon film constituting the selection gate electrode CG and the polycrystalline silicon film constituting the memory gate electrode MG, and the cobalt film and the single crystal silicon constituting the semiconductor substrate 1 (n+-type semiconductor region 2b) are reacted to form a cobalt silicide layer 10. Then, the unreacted part of the cobalt film is removed. The cobalt silicide layer 10 that is formed can reduce the contact resistance of the cobalt silicide layer 10 and the plug and so forth formed thereon, and can reduce the resistance of the selection gate electrode CG, the memory gate electrode MG, the source region Srm, and the drain region Drm.

Figure 23:
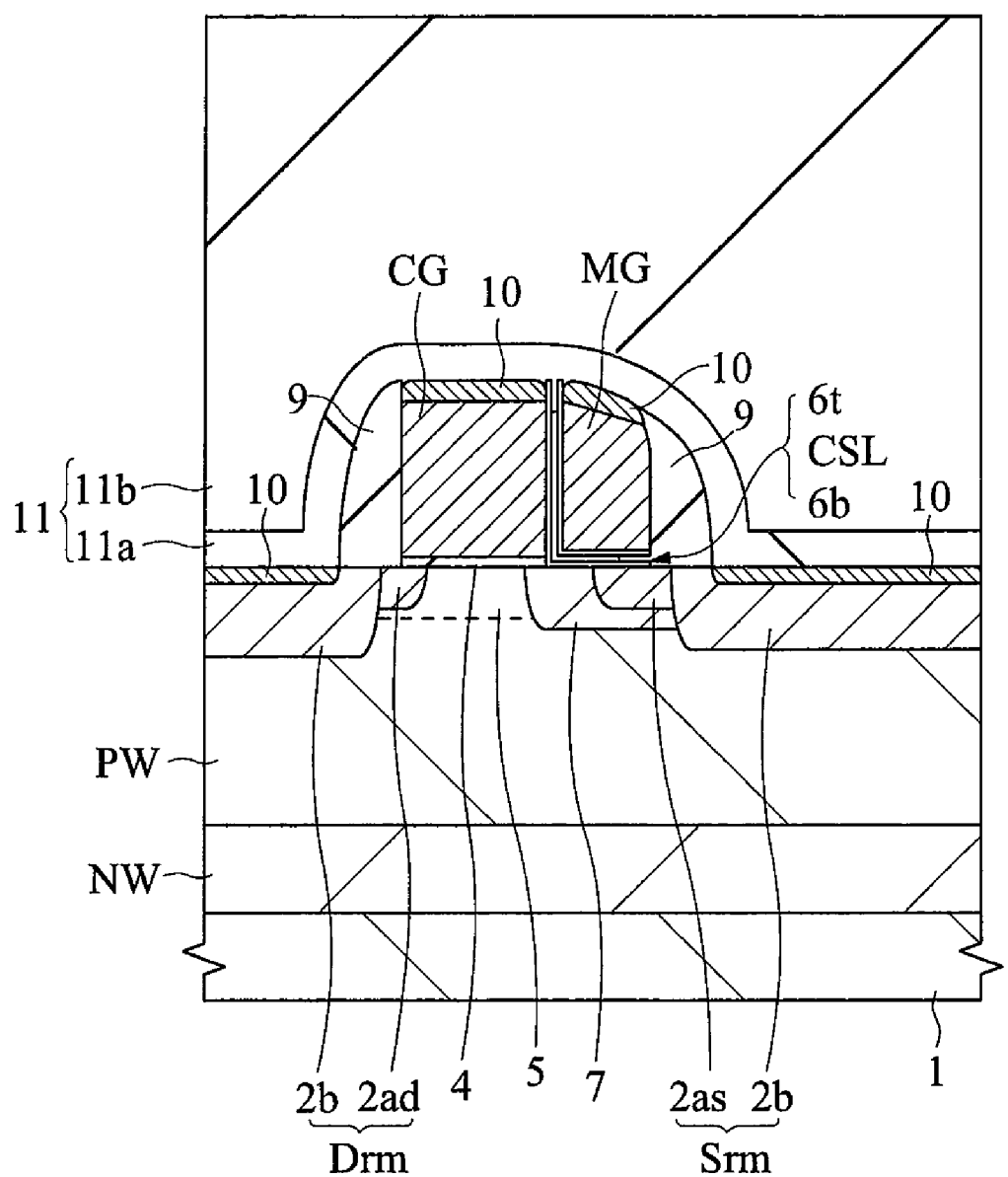
FIG. 23 is a cross-sectional view of main parts of the memory cell shown in FIG. 10 during the manufacturing process after the process of FIG. 22.

Next, as shown in FIG. 23, an interlayer insulation film 11 formed of, for example, a silicon nitride film 11a and a silicon oxide film 11b is formed with the CVD method on the main surface of the semiconductor substrate 1. Next, after forming the contact hole CNT in the interlayer insulation film 11, the plug PLG is formed in the contact hole CNT. The plug PLG has, for example, a relatively thin barrier film formed of a stacked film of titanium and titanium nitride, and a relatively thick conductor film including tungsten or aluminum formed to be wrapped by the barrier film. Then, the first layer interconnection M1 including, for example, tungsten, aluminum, and copper is formed on the interlayer insulation film 11 to obtain the substantially complete memory cell MC1 shown in FIG. 3. After this process, the semiconductor device is manufactured through conventional manufacturing processes of the semiconductor devices.

Thus, according to Embodiment 1, the charge storage layer CSL that intervenes between the memory gate electrode MG and the semiconductor substrate 1 of the nMIS (Qnm) for the memory is formed shorter than the gate length of the memory gate electrode MG or the insulating films 6b and 6t located on and under the charge storage layer CSL to control the overlapping amount of the charge storage layer CSL, and the source region Srm to be less than 40 nm (preferably in the range from 10 to 30 nm), to obtain a smaller varied amount of the threshold voltage when the memory cell MC1 is held at a high temperature in the writing state. Thereby, the data retention characteristic of the split-gate type MONOS memory cell MC1 can be improved.

Embodiment 2

In Embodiment 2, an example of a split-gate type MONOS memory cell will be described that has a structure different from the one in Embodiment 1 that can control the overlapping amount of the charge storage layer and the source region. A method of manufacturing the split-gate type MONOS memory cell according to Embodiment 2 will be described with reference to FIGS. 24 to 30. FIGS. 24 to 29 are cross-sectional view of main parts of the memory cell during the manufacturing process of the semiconductor device; and FIG. 30 is a graph chart showing the characteristics for holding at a high temperature of the memory cell in the writing state after rewriting 10K times. The array configuration and operating conditions of the split-gate type MONOS memory cell according to Embodiment 2 are the same as that of Embodiment 1 mentioned above. The manufacturing processes before forming a selection gate electrode CG of an nMIS (Qnc) for selection, and a memory gate electrode MG of an nNMIS (Qnm) for a memory are the same as the manufacturing processes of the memory cell MC1 (FIG. 15) of Embodiment 1 mentioned above, and descriptions therefor are omitted.

Figure 24:
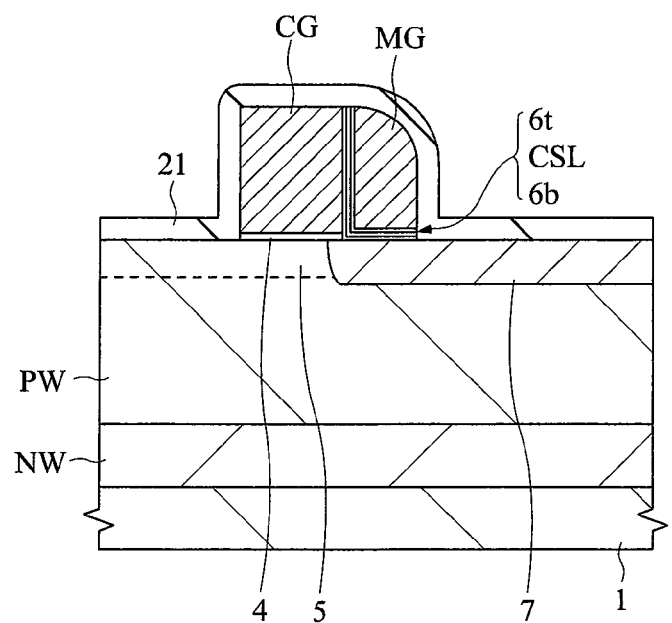
FIG. 24 is a cross-sectional view of main parts of the split-gate type MONOS memory cell during the manufacturing process according to Embodiment 2 of the present invention.

After the manufacturing process described using FIG. 15, as shown in FIG. 24, an insulating film 21 with a thickness of approximately 50 nm formed of a silicon oxide film is deposited with the CVD method on the main surface of the semiconductor substrate 1.

Figure 25:
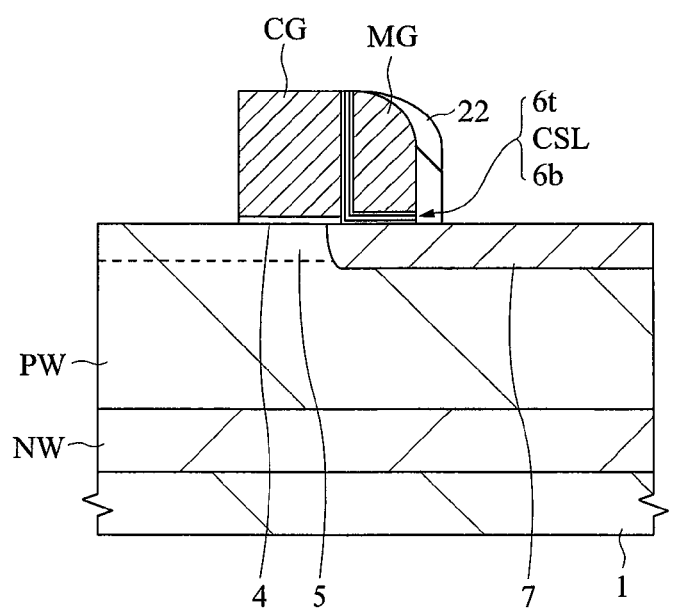
FIG. 25 is a cross-sectional view of main parts of the memory cell shown in FIG. 24 during the manufacturing process after the process of FIG. 24.

Next, as shown in FIG. 25, the insulating film 21 is etched back with an anisotropic dry etching method, and the sidewall formed on one side of the selection gate electrode CG is removed to form a sidewall 22 on one side of the memory gate electrode MG. The spacer length of the sidewalls 22 is approximately 20 to 40 nm, for example.

Figure 26:
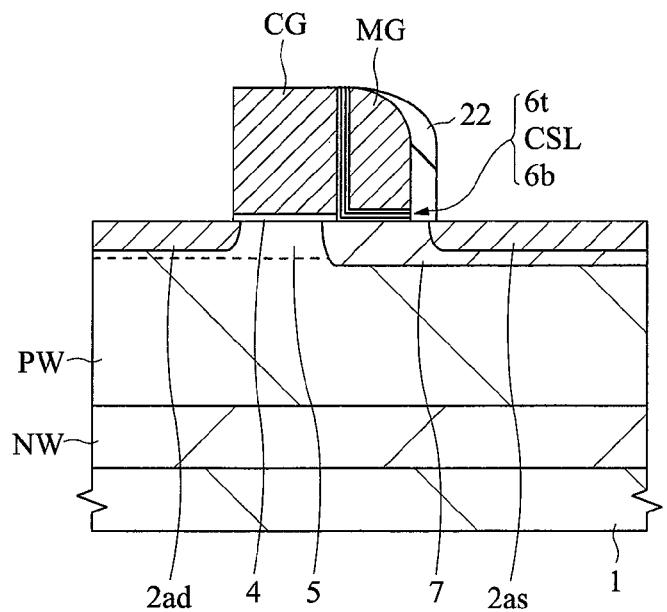
FIG. 26 is a cross-sectional view of main parts of the memory cell shown in FIG. 24 during the manufacturing process after the process of FIG. 25.

Next, as shown in FIG. 26, an n⁻-type semiconductor region 2as is formed on the main surface of the semiconductor substrate 1 in a self-alignment manner to the memory gate electrode MG, and an n⁻-type semiconductor region 2ad is formed on the main surface of the semiconductor substrate 1 in a self alignment manner to the selection gate electrode CG. After an n-type impurity for forming the n-type semiconductor regions 2as and 2ad is ion-implanted, a p-type impurity such as boron can be ion-implanted to the main surface of the semiconductor substrate 1 to form a p-type semiconductor region so as to surround the lower part of the n⁻-type semiconductor region 2as and 2ad.

Figure 27:
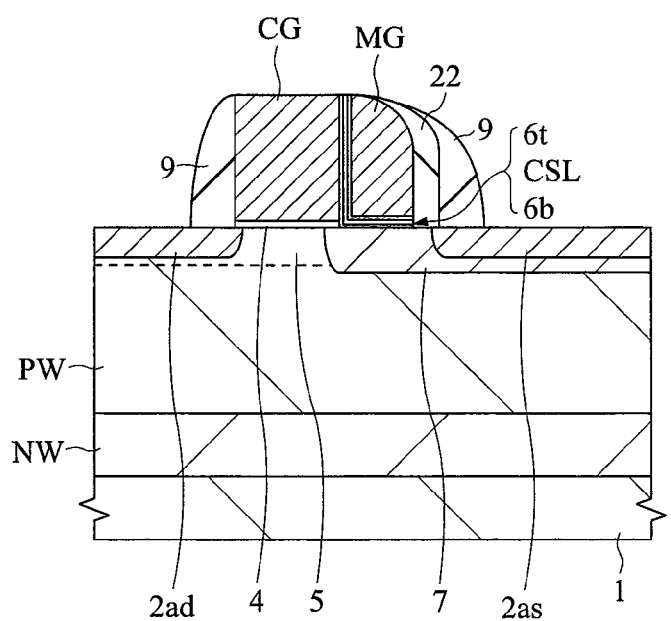
FIG. 27 is a cross-sectional view of main parts of the memory cell shown in FIG. 24 during the manufacturing process after the process of FIG. 26.

Next, as shown in FIG. 27, after depositing an insulating film with a thickness of approximately 80 nm formed of, e.g., a silicon oxide film with the plasma CVD method on the main surface of the semiconductor substrate 1, the obtained insulating film is etched back with an anisotropic dry etching method to form sidewalls 9 on one side of the selection gate electrode CG and on one side of the memory gate electrode MG. The spacer length of the sidewalls 9 is approximately 60 nm, for example.

Figure 28:
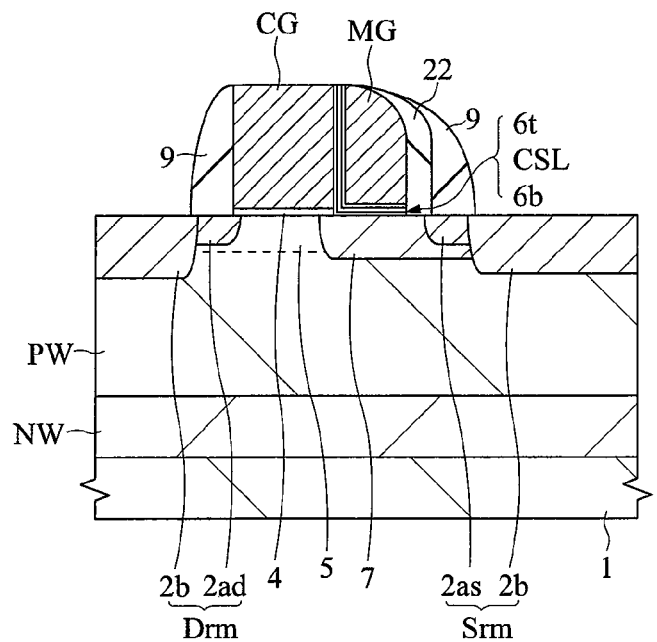
FIG. 28 is a cross-sectional view of main parts of the memory cell shown in FIG. 24 during the manufacturing process after the process of FIG. 27.

Next, as shown in FIG. 28, an n-type impurity such as arsenic and phosphorus is ion-implanted to the main surface of the semiconductor substrate 1 by using the sidewalls 9 as a mask to form an n+-type semiconductor region 2b on the main surface of the semiconductor substrate 1 in a self alignment manner to the selection gate electrode CG and the memory gate electrode MG. Thereby, a drain region Drm including the n⁻-type semiconductor region 2ad and the n+-type semiconductor region 2b, and a source region Srm including the n⁻-type semiconductor region 2as and the n+-type semiconductor region 2b are formed.

Figure 29:
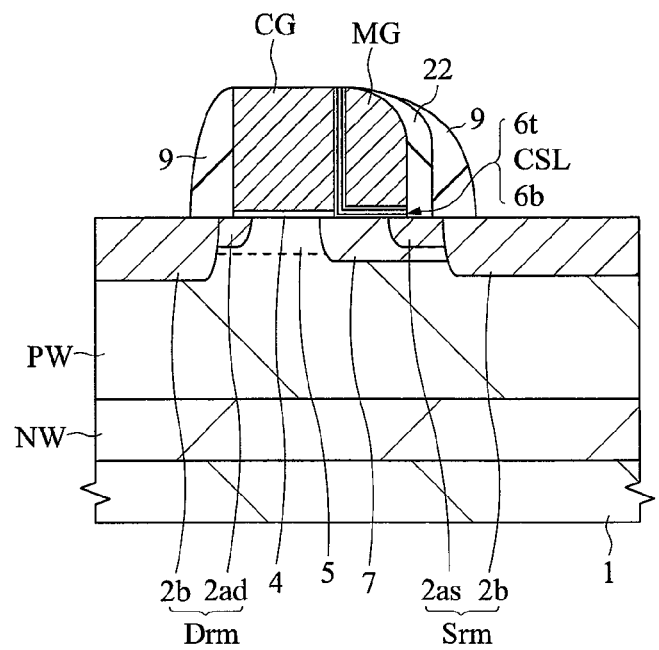
FIG. 29 is a cross-sectional view of main parts of the memory cell shown in FIG. 24 during the manufacturing process after the process of FIG. 28.
Figure 30:
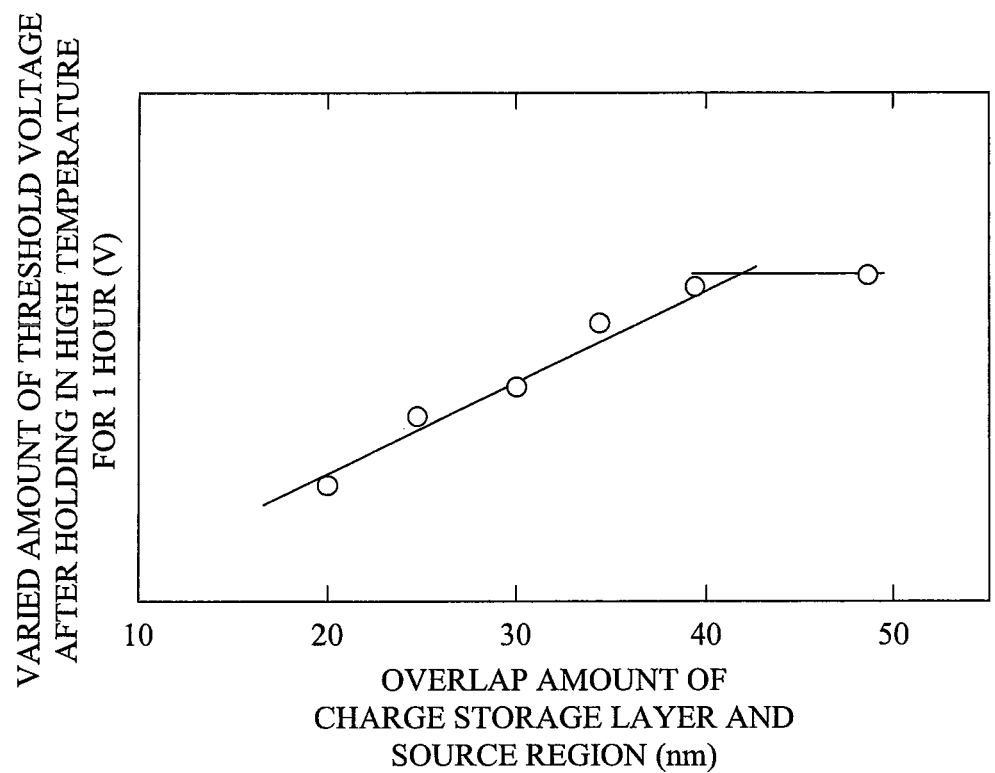
FIG. 30 is a graph chart showing the characteristics for holding at a high temperature of the memory cell in the writing state after rewriting 10K times according to Embodiment 2 of the present invention.

Next, as shown in FIG. 29, the semiconductor substrate 1 is heat-treated to extend the source region Srm to the area under the memory gate electrode MG to determine the overlapping amount of the charge storage layer CSL and the source region Srm. The overlapping amount can be adjusted with the spacer length of the sidewall 22.

Then, in the same manner as Embodiment 1 mentioned above, after forming, e.g., a cobalt silicide layer 10 in a self alignment manner on the top surface of the selection gate electrode CG and the memory gate electrode MG, and on the top surface of the n+-type semiconductor region 2b, an interlayer insulation film 11 is formed with the CVD method on the main surface of the semiconductor substrate 1. Next, after forming a contact hole CNT in the interlayer insulation film 11, a plug PLG is formed in the contact hole CNT. Then, a first layer interconnection M1 is formed on the interlayer insulation film 11 to obtain a substantially complete memory cell MC2.

FIG. 30 shows the relation between the varied amount of the threshold voltage of the memory cell, and the overlapping amount of the charge storage layer and the source region when a high temperature is held in the write state for 1 hour after rewriting 10K times. Rewriting of 10K times is performed according to the writing and erasing conditions shown in FIG. 4, and manufacturing and measuring methods, etc. of the sample are the same as indicated in the description of FIG. 8.

As shown in FIG. 30, when the overlapping amount of the charge storage layer and the source region is less than 40 nm, the varied amount of the threshold voltage becomes smaller as the overlapping amount becomes smaller. When the overlapping amount of the charge storage layer and the source region is 40 nm or more, since the holes do not reach the source region Srm in the BTBT system, the variation of the threshold voltage is very small.

From the variation of the threshold voltage of the memory cell when holding at a high temperature in the write state shown in FIG. 30, when, for example, the overlapping amount (Lso) of the memory gate electrode MG and the source region Srm is 10 to 30 nm, the etching amount (Let) of the charge storage layer CSL is 0 nm, and the overlapping amount (Lono) of the charge storage layer CSL and the source region Srm is 10 to 30 nm, an appropriate spacer length of the sidewall 22 is considered to be in the range from 20 to 40 nm.

Thus, according to Embodiment 2, the sidewall 22 having the spacer length of approximately 20 to 40 nm is formed on the side wall of the memory gate electrode MG of the nMIS (Qnm) for the memory to control the overlapping amount of the charge storage layer CSL and the source region Srm to be less than 40 nm (preferably in the range from 10 to 30 nm) to obtain a smaller varied amount of the threshold voltage when the memory cell MC2 is held at a high temperature in the writing state. Thereby, the data retention characteristic of the split-gate type MONOS memory cell MC2 can be improved.

Embodiment 3

Figure 31:
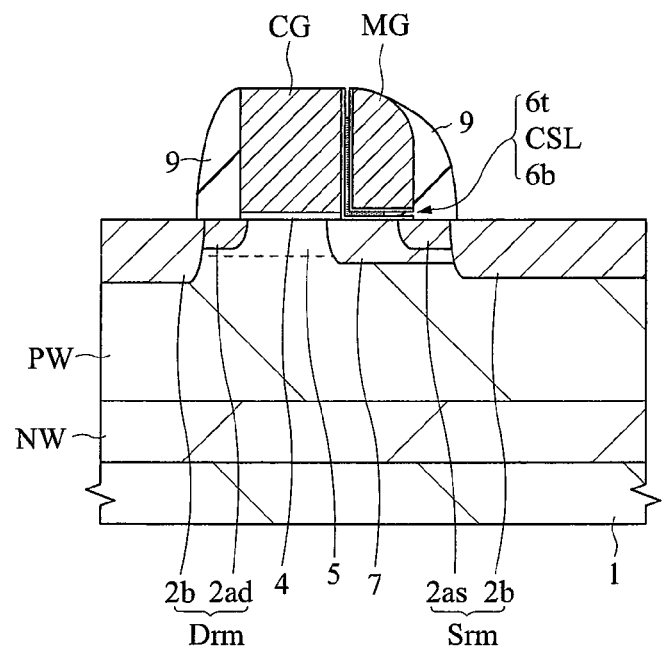
FIG. 31 is a cross-sectional view of main parts of a first example of the split-gate type MONOS memory cell during the manufacturing process according to Embodiment 3 of a present invention.
Figure 32:
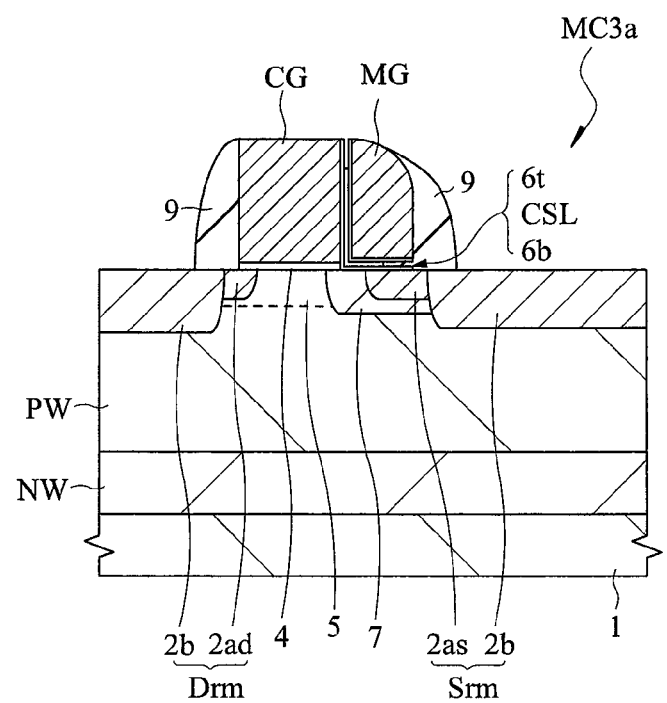
FIG. 32 is a cross-sectional view of main parts of the memory cell shown in FIG. 31 during the manufacturing process after the process of FIG. 31.
Figure 33:
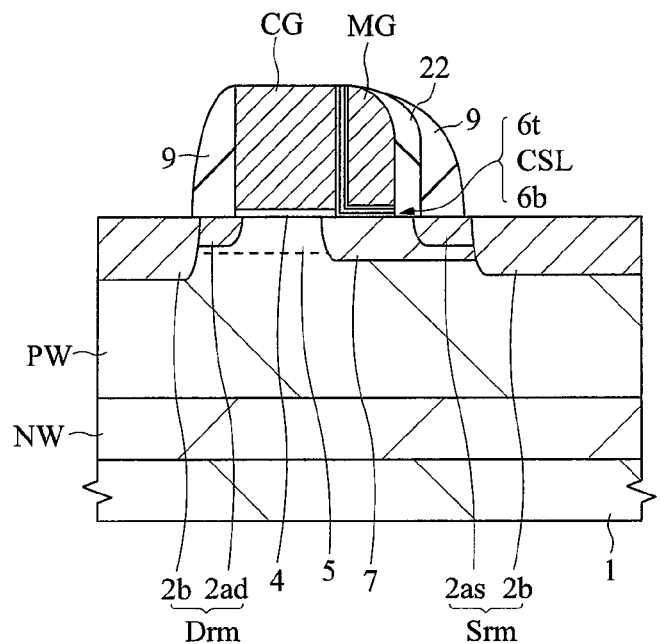
FIG. 33 is a cross-sectional view of main parts of a second example of the split-gate type MONOS memory cell during the manufacturing process according to Embodiment 3 of the present invention.
Figure 34:
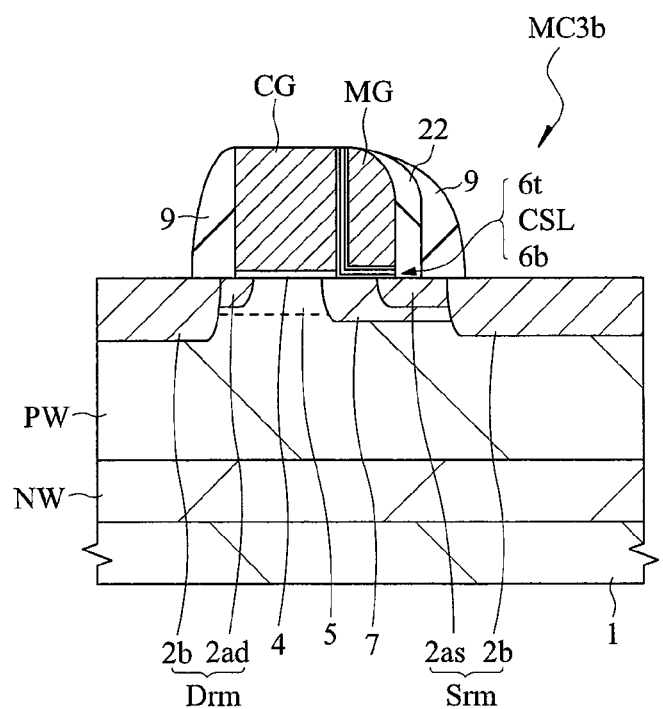
FIG. 34 is a cross-sectional view of main parts of the memory cell shown in FIG. 33 during the manufacturing process after the process of FIG. 33.
Figure 35:
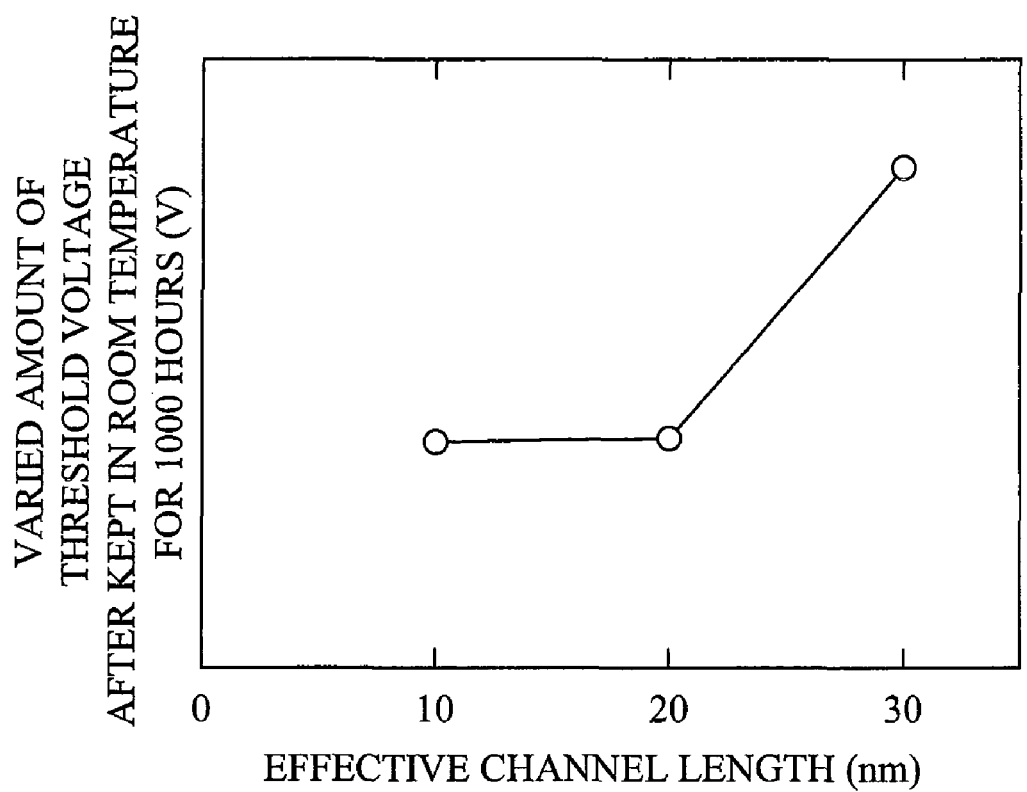
FIG. 35 is a graph chart showing the characteristics for holding at room temperature of the memory cell in the erase state after rewriting 10K times according to Embodiment 3 of the present invention.

In Embodiment 3, an example of a split-gate type MONOS memory cell that can improve the characteristics for holding at room temperature in an erase state by adjusting the effective channel length of a memory gate electrode of an nMIS for a memory will be described using FIGS. 31 to 35. FIGS. 31 and 32 are cross-sectional view of main parts of a first example of the split-gate type MONOS memory cell according to Embodiment 3; FIGS. 33 and 34 are cross-sectional view of main parts of a second example of the split-gate type MONOS memory cell according to Embodiment 3; and FIG. 35 is a graph chart showing the characteristics for holding at room temperature of the memory cell in the erase state after rewriting 10K times. The array configuration and operating conditions of the split-gate type MONOS memory cell according to Embodiment 3 are the same as that of Embodiment 1 mentioned above.

First, the first example of the method of manufacturing the split-gate type MONOS memory cell according to Embodiment 3 will be described with reference to FIGS. 31 and 32. The manufacturing processes before forming a selection gate electrode CG of an nMIS (Qnc) for selection, and a memory gate electrode MG of an nMIS (Qnm) for a memory are the same as the manufacturing processes of the memory cell MC1 (FIG. 15) of Embodiment 1 mentioned above, and descriptions therefor are omitted.

After the manufacturing process described using FIG. 15, as shown in FIG. 31, a charge storage layer CSL is side etched with an isotropic wet etching method to adjust the overlapping amount of the charge storage layer CSL and a source region. The etching amount (Let) of the charge storage layer CSL is 30 to 50 nm (20 to 40 nm for the memory cell MC1 of Embodiment 1 mentioned above). Next, an n$^-$-type semiconductor region 2as is formed on the main surface of the semiconductor substrate 1 in a self alignment manner to the memory gate electrode MG, and an n-type semiconductor region 2ad is formed on the main surface of the semiconductor substrate 1 in a self alignment manner to the selection gate electrode CG. After an n-type impurity forming the n$^-$-type semiconductor regions 2as and 2ad are ion-implanted, a p-type impurity such as boron can be ion-implanted to the main surface of the semiconductor substrate 1 to form a p-type semiconductor region to surround the lower part of the n$^-$-type semiconductor region 2as and 2ad.

Next, after depositing an insulating film with a thickness of approximately 80 nm formed of, e.g., a silicon oxide film with the plasma CVD method on the main surface of the semiconductor substrate 1, the obtained insulating film is etched back with an anisotropic dry etching method to form sidewalls 9 on one side of the selection gate electrode CG and on one side of the memory gate electrode MG. The spacer length of the sidewalls 9 is approximately 60 nm, for example.

Next, an n-type impurity such as arsenic and phosphorus is ion-implanted to the main surface of the semiconductor substrate 1 by using the sidewalls 9 as a mask to form an n$^+$-type semiconductor region 2b on the main surface of the semiconductor substrate 1 in a self alignment manner to the selection gate electrode CG and the memory gate electrode MG. Thereby, a drain region Drm including the n$^-$-type semiconductor region 2ad and the n$^+$-type semiconductor region 2b, and the source region Srm including the n$^-$-type semiconductor region 2as and the n$^+$-type semiconductor region 2b are formed.

Next, as shown in FIG. 32, the semiconductor substrate 1 is heat-treated to extend the source region Srm to the area under the memory gate electrode MG to determine the overlapping amount of the charge storage layer CSL and the source region Srm and the effective channel length of the memory gate electrode MG. For example, spike annealing at 1,050° C. to the semiconductor substrate 1 for 10 seconds can extend the source region Srm by approximately 60 nm.

Even when the overlapping amount (Lso) of the memory gate electrode MG and the source region Srm is 60 nm (50 nm for the memory cell MC1 of Embodiment 1 mentioned above), as mentioned above, since the etching amount (Let) of the charge storage layer CSL is 30 to 50 nm (20 to 40 nm for the memory cell MC1 of Embodiment 1 mentioned above), the overlapping amount (Lono) of the charge storage layer CSL and the source region Srm can be in the appropriate range of 10 to 30 nm and, at the same time, the effective channel length (Lch) of the memory gate electrode MG can be shortened. For example, a memory cell MC2 with the memory gate electrode MG of 80 nm in the gate length (Lg) can have the effective channel length (Lch) of 20 nm in the memory gate electrode MG (30 nm for the memory cell MC1 of the Embodiment 1 mentioned above.) Then, in the same manner as Embodiment 1 mentioned above, after forming, e.g., a cobalt silicide layer 10 in a self alignment manner on the top surface of the selection gate electrode CG and the memory gate electrode MG, and on the top surface of the n$^+$-type semiconductor region 2b, an interlayer insulation film 11 is formed with the CVD method on the main surface of the semiconductor substrate 1. Next, after forming a contact hole CNT in the interlayer insulation film 11, a plug PLG is formed in the contact hole CNT. Then, a first layer interconnection M1 is formed on the interlayer insulation film 11 to obtain a substantially complete memory cell MC3a.

Next, the second example of the method of manufacturing the split-gate type MONOS memory cell according to Embodiment 3 will be described with reference to FIGS. 33 and 34. The manufacturing processes before forming the selection gate electrode CG of the nMIS (Qnc) for selection, and the memory gate electrode MG of the nMIS (Qnm) for the memory are the same as the manufacturing processes of the memory cell MC2 (FIG. 25) of Embodiment 2 mentioned above, and descriptions therefor are omitted. However, the gate length of the memory gate electrode MG is formed shorter, for example by approximately 10 nm, than that of the gate electrode MG of the memory cell MC2 of Embodiment 2 mentioned above.

After the manufacturing process described using FIG. 25, as shown in FIG. 33, a sidewall 22 is formed only on one side of the memory gate electrode MG. Then, the n⁻-type semiconductor region 2as is formed on the main surface of the semiconductor substrate 1 in a self alignment manner to the memory gate electrode MG, and the n⁻-type semiconductor region 2ad is formed on the main surface of the semiconductor substrate 1 in a self alignment manner to the selection gate electrode CG. After the n-type impurity forming the n⁻-type semiconductor regions 2as and 2ad are ion-implanted, the p-type impurity such as boron can be ion-implanted to the main surface of the semiconductor substrate 1 to form the p-type semiconductor region to surround the lower part of the n⁻-type semiconductor regions 2as and 2ad.

Next, after depositing an insulating film with a thickness of approximately 80 nm formed of, e.g., a silicon oxide film with the plasma CVD method on the main surface of the semiconductor substrate 1, the obtained insulating film is etched back with an anisotropic dry etching method to form sidewalls 9 on one side of the selection gate electrode CG and on one side of the memory gate electrode MG. The spacer length of the sidewalls 9 is approximately 60 nm, for example.

Next, an n-type impurity such as arsenic and phosphorus is ion-implanted to the main surface of the semiconductor substrate 1 by using the sidewalls 9 as a mask to form the n⁺-type semiconductor region 2b on the main surface of the semiconductor substrate 1 in a self alignment manner to the selection gate electrode CG and the memory gate electrode MG. Thereby, the drain region Drm including the n⁻-type semiconductor region 2ad and the n⁺-type semiconductor region 2b, and the source region Srm including the n⁻-type semiconductor region 2as and the n⁺-type semiconductor region 2b are formed.

Next, as shown in FIG. 34, the semiconductor substrate 1 is heat-treated to extend the source region Srm to the area under the memory gate electrode MG to determine the overlapping amount of the charge storage layer CSL and the source region Srm and the effective channel length of the memory gate electrode. For example, spike annealing at 1,000° C. to the semiconductor substrate 1 for 10 seconds can extend the source region Srm by approximately 50 nm. Thereby, the overlapping amount (Lono) of the charge storage layer CSL and the source region Srm can be in the appropriate range of 10 to 30 nm and, at the same time, the effective channel length (Lch) of the memory gate electrode MG can be formed shorter, for example by approximately 10 nm, than the channel length (Lch) of the memory gate electrode MG of the memory cell MC2 of Embodiment 2 mentioned above.

Then, in the same manner as Embodiment 1 mentioned above, after forming, e.g., the cobalt silicide layer 10 in a self alignment manner on the top surface of the selection gate electrode CG and the memory gate electrode MG, and on the top surface of the n⁺-type semiconductor region 2b, the interlayer insulation film 11 is formed with the CVD method on the main surface of the semiconductor substrate 1. Next, after forming the contact hole CNT in the interlayer insulation film 11, the plug PLG is formed in the contact hole CNT. Then, the first layer interconnection M1 is formed on the interlayer insulation film 11 to obtain a substantially complete memory cell MC3b.

FIG. 35 shows the relation between the varied amount of the threshold voltage of the memory cell, and the effective channel length of the gate electrode of the nMIS for the memory when the room temperature is held in the erase state for 1,000 hours after rewriting 10K times. Rewriting of 10K times is performed according to the writing and erasing conditions shown in FIG. 4, and manufacturing and measuring methods, and the like of the sample are the same as indicated in the description of FIG. 8.

To make the variation of the threshold voltage of the memory cell smaller when holding at room temperature in the erase state, the amount of electrons that exist in the inversion layer in the semiconductor substrate and that couple with holes in the charge storage layer via the defect, produced by rewriting, of the insulating film on the semiconductor substrate side must be reduced. Therefore, the apparent amount of holes is reduced by shortening the effective channel length of the memory gate electrode to obtain a smaller electric field in the lengthwise direction to the main surface of the semiconductor substrate. This reduces the amount of the electrons that couple with the holes decreases, resulting in a smaller variation of the threshold voltage of the memory cell. In addition, since the BTBT system is used for erasing, the holes that determine the threshold voltage are locally existed and distributed in the charge storage layer. Therefore, as shown in FIG. 35, a reduction of the effective channel length from 30 nm to 20 nm suddenly reduced the threshold voltage. Therefore, an appropriate effective channel length of the memory gate electrode is considered to be 30 nm or less, for example (the range is not limited thereto depending on other conditions). Moreover, a range suitable for mass production is considered to be 20 nm or less.

Thus, according to Embodiment 3, in the same manner as Embodiment 1 and 2 mentioned above, the overlapping amount of the charge storage layer CSL and the source region Srm less than 40 nm (preferably in the range from 10 to 30 nm) and the effective channel length (Lch) of the memory gate electrode MG not more than 30 nm (preferably not more than 20 nm) reduce the electric field in the direction vertical to the main surface of the semiconductor substrate 1 to cause fewer coupling of electrons with holes, resulting in the smaller varied amount of the threshold voltage when holding the memory cells MC3a and the MC3b at a high temperature in the writing state and the smaller varied amount of the threshold voltage when holding the memory cell at room temperature in the erase state. Thereby, the data retention characteristic of the split-gate type MONOS memory cells MC3a and MC3b can be improved.

Embodiment 4

Figure 42:
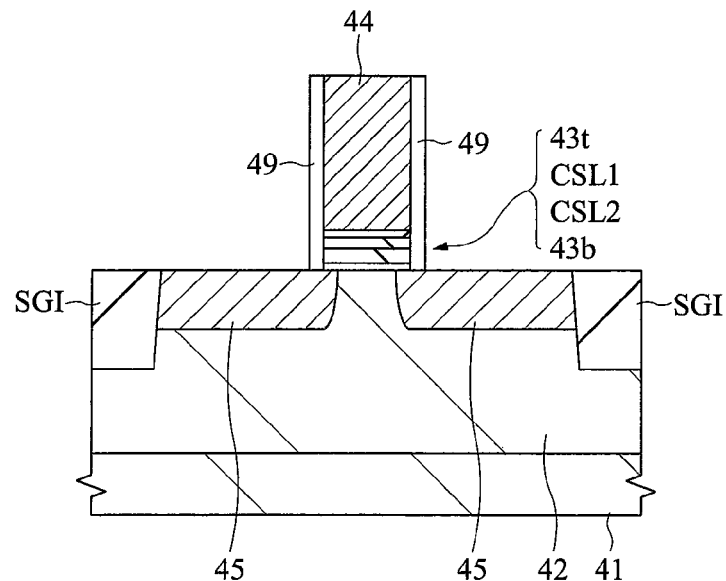
FIG. 42 is a cross-sectional view of main parts of the second example of the NROM memory cell during the manufacturing process according to Embodiment 4 of the present invention.
Figure 43:
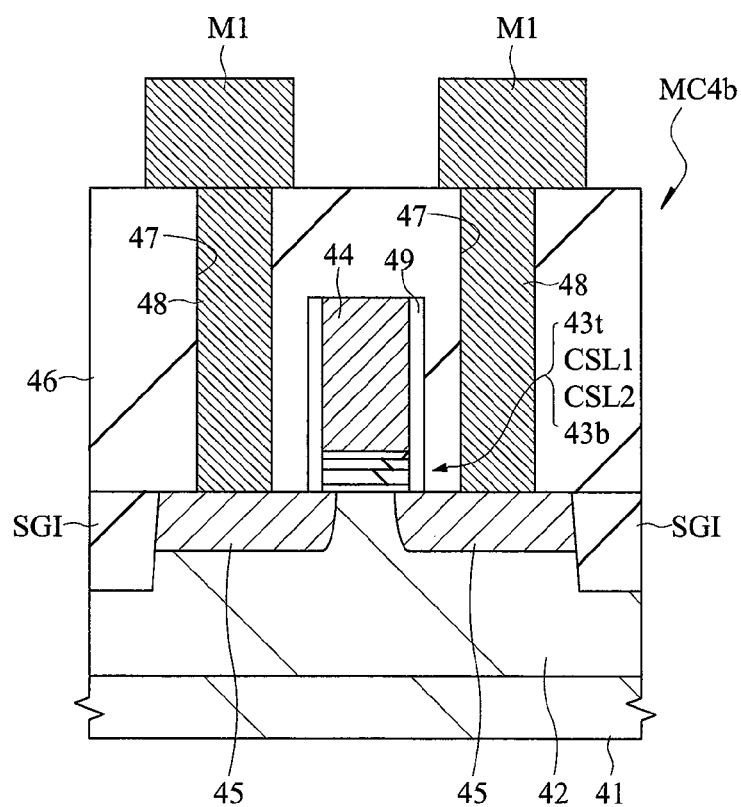
FIG. 43 is a cross-sectional view of main parts of the memory cell shown in FIG. 42 during the manufacturing process after the process of FIG. 42.
Figure 44:
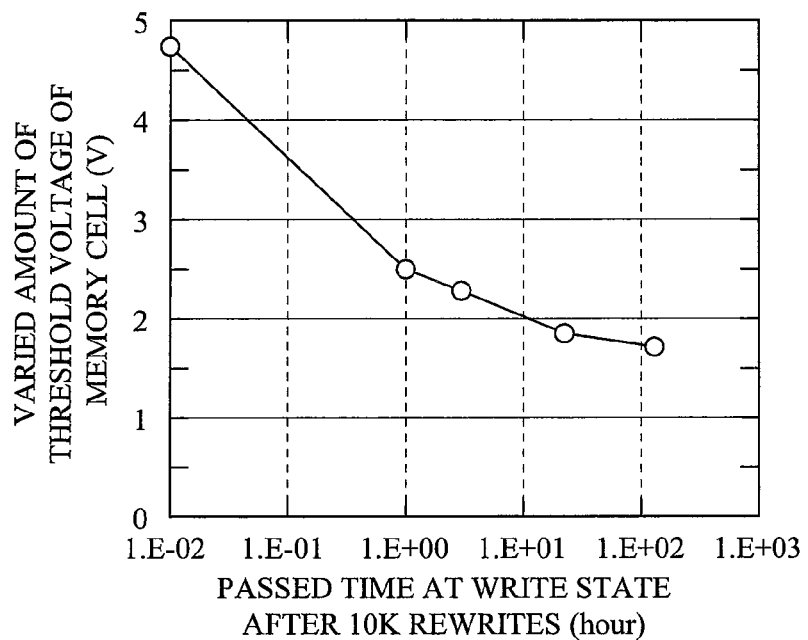
FIG. 44 is a graph chart showing an example of the characteristics for holding at a high temperature of the memory cell in the write state after writing is performed in the SSI system and erasing is performed in the BTBT system, resulting in rewriting of 10K times.

An example of the structure of an NROM memory cell according to Embodiment 4 will be described with reference to FIGS. 36 to 43. The NROM memory cell also has a problem in which, in the same manner as the split-gate type MONOS memory cell, a threshold voltage of a memory cell gradually decreases as the holding time passes as to characteristics for holding at a high temperature in the write state, and the threshold voltage of the memory cell gradually increases as the holding time passes as to characteristics for holding at room temperature in the erase state. In Embodiment 4, the control method of the overlapping amount of a charge storage layer and a source region, which has been described with the split-gate type MONOS memory cells of Embodiments 1 and 2 mentioned above, is applied to the NROM memory cell. FIGS. 36 to 40 are cross-sectional view of main parts of a first example of the NROM memory cell according to Embodiment 4; FIG. 41 is a table summarizing an example of conditions for applying the voltage to each part of the memory cell during write, erase, and read operations; and FIGS. 42 and 43 are cross-sectional view of main parts of a second example of the NROM memory cell according to Embodiment 4.

The method of manufacturing the first example of the NROMMOS memory cell according to Embodiment 4 will be described with reference to FIGS. 36 to 40.

Figure 36:
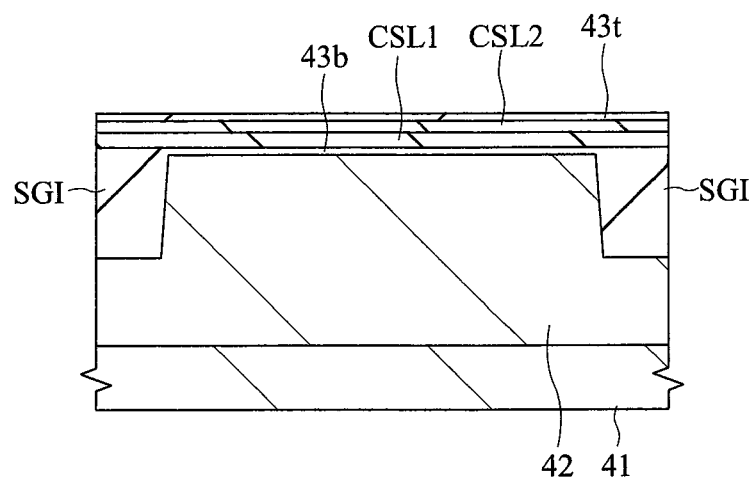
FIG. 36 is a cross-sectional view of main parts of the first example of the NROM memory cell during the manufacturing process according to Embodiment 4 of the present invention.

First, as shown in FIG. 36, a semiconductor substrate 41 consisting of a p-type single crystal silicon (a thin flat board in an approximate circle shape of a semiconductor called a semiconductor wafer in this stage) having a resistivity of approximately 1 to 10 Ω.cm is prepared. Next, on the main surface of the semiconductor substrate 1, a trench shaped device isolation portion SGI, for example, the active region located to be surrounded thereby, etc. are formed. Subsequently, a p-type impurity is selectively introduced to a specified part of a semiconductor substrate 41 with a specified energy by ion implant etc. to form a p-well 42 having an impurity concentration of appropriately $1 \times 10^{17}$ cm$^{-3}$.

Next, by performing an oxidation treatment to the semiconductor substrate 41, an insulating film 43$b$ with a thickness of approximately 4 nm formed of, e.g., a silicon oxide film is formed on the main surface of the semiconductor substrate 41. Next, a charge storage layer CSL1 with a thickness of approximately 6 nm formed of, e.g., a silicon nitride film is deposited with the CVD method on the insulating film 43$b$, and a charge storage layer CSL2 with a thickness of approximately 5 nm formed of, e.g., a silicon nitride film with oxygen is deposited on the charge storage layer CSL1. Generally, although SiH$_2$Cl$_2$ and NH$_3$ are used as source gasses in the CVD method to form a silicon nitride film, a silicon nitride film with a specified concentration of oxygen can be formed by adding an oxidizer (such as N$_2$O) to the source gases and controlling the flow rate of NH$_3$. Addition of oxygen can enlarge the band gap of the silicon nitride film. In the charge storage layer CSL2 formed of the silicon nitride film with oxygen, the composition ratio of oxygen to nitrogen is 1:1.

Next, an insulating film 43$t$ with a thickness of approximately 1 nm formed of, e.g., an oxide film is formed on the charge storage layer CSL2. The ISSG (In-Site Steam Generation) oxidation method is used in forming the insulating film 43$t$. Since the film thickness of the charge storage layer CSL2 is reduced by oxidization in the ISSG oxidation method, when depositing the charge storage layer CSL2, the thickness of the deposited film of the charge storage layer CSL2 must be configured, taking the reduction of the film thickness by the oxidization into consideration beforehand. Thereby, a stacked insulating film comprising the insulating film 43$b$, the charge storage layers CSL1, CSL2, and the insulating film 43$t$ is formed.

Figure 37:
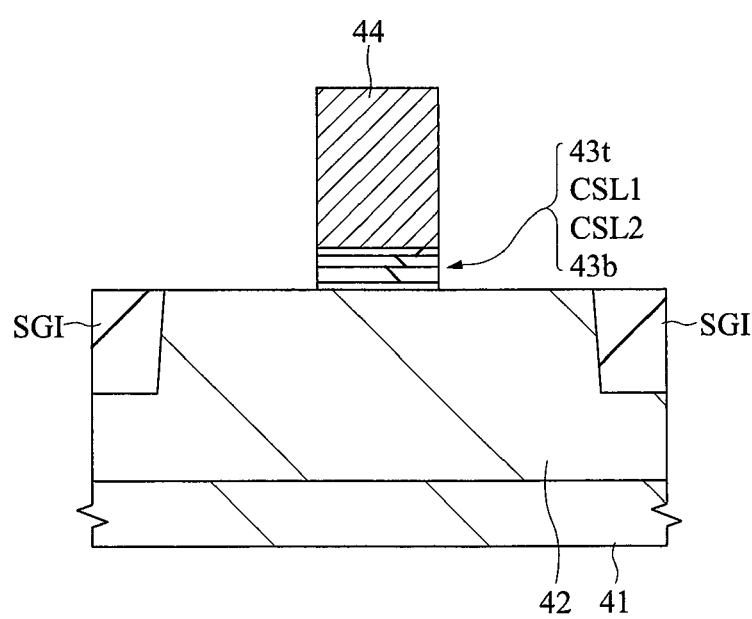
FIG. 37 is a cross-sectional view of main parts of the memory cell shown in FIG. 36 during the manufacturing process after the process of FIG. 36.

Next, as shown in FIG. 37, a conductor film formed of a polycrystalline silicon film with an impurity concentration of approximately $2 \times 10^{20}$ cm$^{-3}$ is deposited on the insulating film 43$t$. The conductor film is formed by the CVD method, and has a thickness of approximately 150 nm, for example. Subsequently, the conductor film is processed by using a resist pattern as a mask, and a gate electrode 44 is formed. Then, leaving a part of the insulating films 43$b$ and 43$t$, and the charge storage layers CSL1 and CSL2 between the gate electrode 44 and the semiconductor substrate 41, the insulating film 43$b$ and 43$t$ and the charge storage layer CSL1 and CSL2 in the other area are selectively removed.

Figure 38:
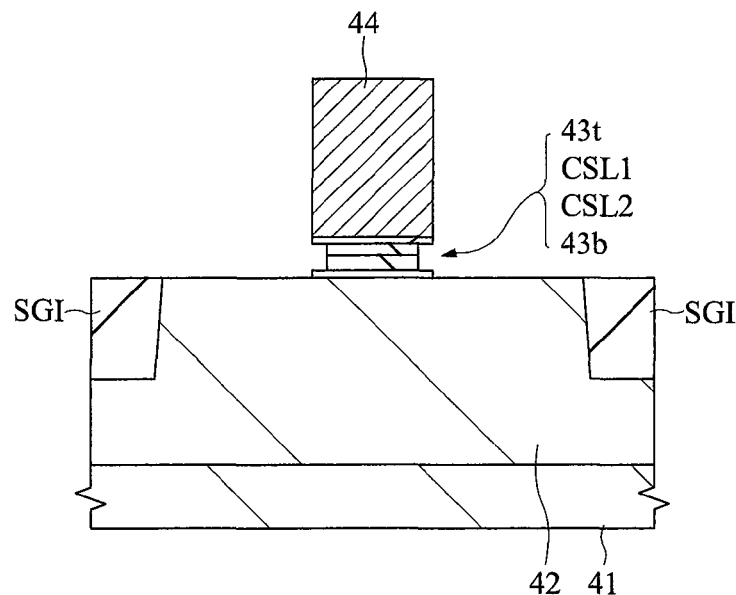
FIG. 38 is a cross-sectional view of main parts of the memory cell shown in FIG. 36 during the manufacturing process after the process of FIG. 37.

Next, as shown in FIG. 38, the charge storage layer CSL1 and CSL2 are side etched with an isotropic wet etching method to adjust the overlapping amount of the charge storage layers CSL1 and CSL2, and the source region. For example, the charge storage layer CSL1 and CSL2 can be etched using heated phosphoric acid at approximately 160° C., and the etching amount is controlled by the etching time.

Figure 39:
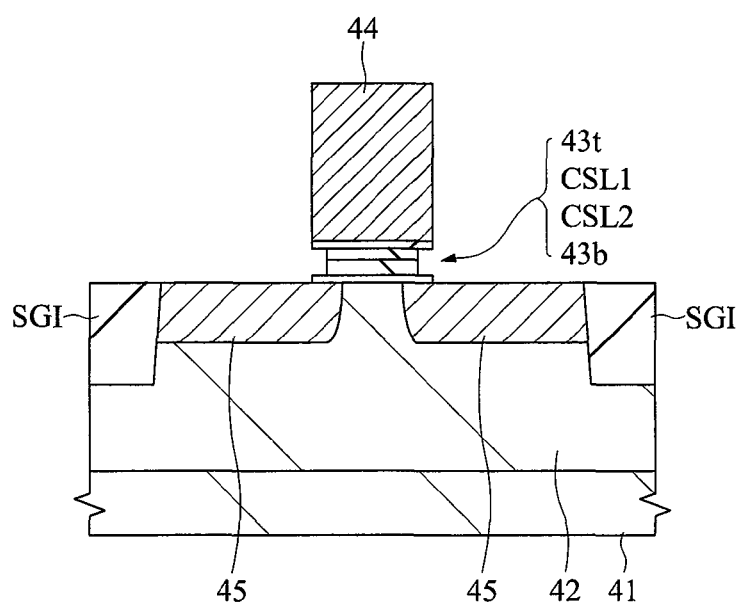
FIG. 39 is a cross-sectional view of main parts of the memory cell shown in FIG. 36 during the manufacturing process after the process of FIG. 38.
Figures 40, 41:
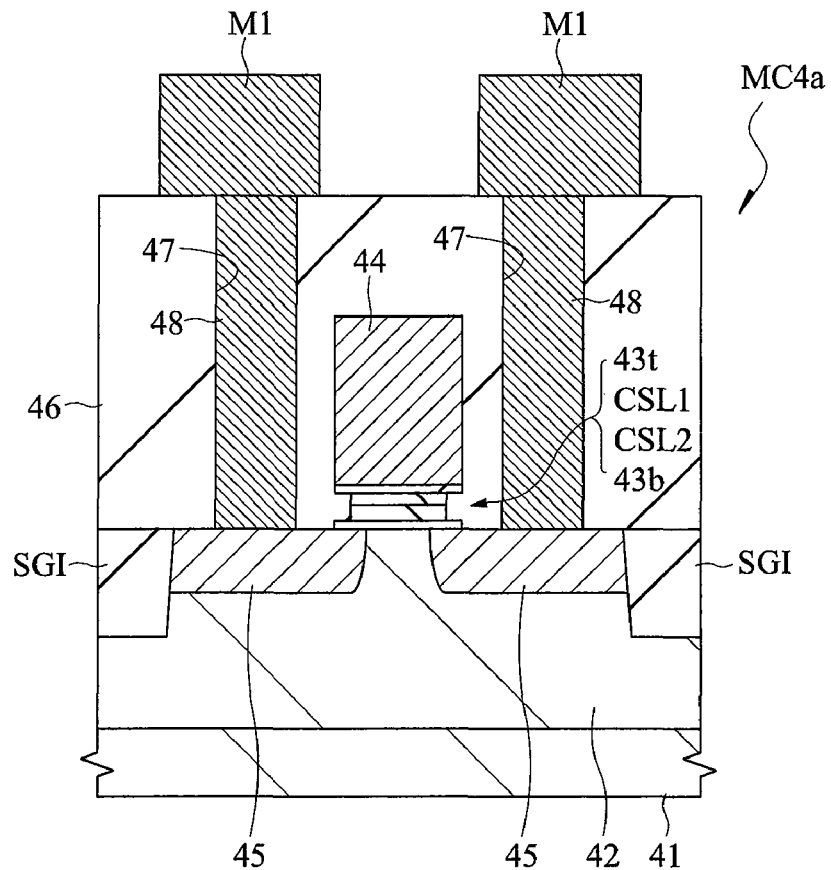
FIG. 40 is a cross-sectional view of main parts of the memory cell shown in FIG. 36 during the manufacturing process after the process of FIG. 39.
FIG. 41 is a table summarizing an example of conditions for applying the voltage to each part of the NROM memory cell during write, erase, and read operations according to Embodiment 4 of the present invention.

Next, as shown in FIG. 39, an n-type impurity such as arsenic is ion-implanted to the main surface of the semiconductor substrate 41 by using the gate electrode 44 as a mask to form an n$^+$-type semiconductor region on the main surface of the semiconductor substrate 41 in a self alignment manner to the gate electrode 44. The implanting energy of the impurity ion in this process is approximately 40 keV and the dose is approximately $2 \times 10^{15}$ cm$^{-2}$, for example. Subsequently, the n-type impurity ion-implanted is activated by heat treating for 60 seconds at a temperature of approximately 950° C., for example, to form source drain regions 45.

Next, as shown in FIG. 40, an interlayer insulation film 46 is formed with the CVD method on the main surface of the semiconductor substrate 41. Next, after forming contact holes 47 in the interlayer insulation film 46, plugs 48 is formed in the contact holes 47. Subsequently, a first layer interconnection M1 including, for example, tungsten, aluminum, copper, and the like is formed on the interlayer insulation film 46 to obtain a substantially complete memory cell MC4$a$. After this process, the semiconductor device is manufactured through conventional manufacturing processes of the semiconductor devices.

FIG. 41 summarizes the voltages Vs and Vd applied to the source drain region, the voltage Vmg applied to the gate electrode, and the voltage Vsub applied to the semiconductor substrate of the NROM memory cell during the write, erase, and read operations. The voltages shown in FIG. 41 are examples of application conditions, and those are not limited thereto, and modifications are possible if needed.

When a write operation by the SSI system and an erase operation by the BTBT system was performed to the memory cell MC4$a$ under the application conditions of each voltage shown in FIG. 41, the variation of the threshold voltage of the memory cell MC4$a$ was smaller than the variation of the threshold voltage of the memory cell with the overlapping amount larger than 40 nm of the charge storage layers CSL1 and CSL2, and the source drain region 45.

Next, the method of manufacturing the second example of the NROM memory cell according to Embodiment 4 will be described with reference to FIGS. 42 and 43. The manufacturing processes before forming the gate electrode 44 are the same as the manufacturing process of the memory cell MC4$a$ (FIG. 37) mentioned above, and descriptions therefor are omitted.

After the manufacturing process described using FIG. 37, as shown in FIG. 42, an insulating film with a thickness of approximately 20 nm formed of, e.g., a silicon oxide film is deposited with the CVD method on the main surface of the semiconductor substrate 41. Then, the insulating film is etched back with an anisotropic dry etching method to form sidewalls 49 on the side of the gate electrode 44. The spacer length of the sidewalls 49 is approximately 20 nm, for example.

Next, the n-type impurity such as arsenic is ion-implanted to the main surface of the semiconductor substrate 1 by using the gate electrode 44 as a mask to form the n$^+$-type semiconductor region on the main surface of the semiconductor substrate 41 in a self alignment manner to the gate electrode 44.

The implanting energy of the impurity ion in this process is approximately 40 keV and the dose is approximately $2 \times 10^{15}$ cm$^{-2}$ for example. Subsequently, the n-type impurity ion-implanted is activated by heat treating for 60 seconds at a temperature of approximately 950° C. to form a source drain regions 45.

Next, as shown in FIG. 43, an interlayer insulation film 46 is formed with the CVD method on the main surface of the semiconductor substrate 41. Then, after forming the contact holes 47 in the interlayer insulation film 46, the plugs 48 are formed in the contact holes 47. Subsequently, the first layer interconnection M1 including, for example, tungsten, aluminum copper, and the like is formed on the interlayer insulation film 46 to obtain a substantially complete memory cell MC4b. After this process, the semiconductor device is manufactured through conventional manufacturing processes of the semiconductor devices.

When a write operation by the SSI system and an erase operation by the BTBT system were performed to the memory cell MC4b under the application conditions of each voltage shown in FIG. 41, in the same manner as the memory cell MC4a, the variation of the threshold voltage of the memory cell MC4b was smaller than the variation of the threshold voltage of the memory cell with the overlapping amount larger than 40 nm of the charge storage layer and the source drain region.

Thus, according to Embodiment 4, the charge storage layer CSL1 and CSL2 that intervene between the gate electrode 44 and the semiconductor substrate 1 are formed shorter than the gate length of the gate electrode 44, or the insulating films 43b and 43t located on and under the charge storage layers CSL1 and CSL2, or the sidewalls 49 having the spacer length of approximately 20 to 40 nm are formed on the side walls of the gate electrode 44 to control the overlapping amount of the charge storage layer CSL1 and CSL2, and the source region Srm to be less than 40 nm (preferably in the range from 10 to 30 nm) to obtain a smaller varied amount of the threshold voltage when the memory cells MC4a and the MC4b are held at a high temperature in the writing state, and a smaller varied amount of the threshold voltage when holding the memory cells MC4a and the MC4b at room temperature in the erase state. Thereby, the data retention characteristic of the NROM memory cells MC4a and MC4b can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a semiconductor memory having a nonvolatile memory cell that stores an electric charge in an insulating film such as a nitride film.

What is claimed is:

1. A nonvolatile semiconductor device having a field effect transistor, the field effect transistor comprising:
    a gate insulating film formed on a main surface of a semiconductor substrate, the gate insulating film including a first insulating film, a charge storage layer formed over the first insulating film and having a capability to accumulate electric charges and a second insulating film formed over the charge storage layer;
    a gate electrode formed on the gate insulating film;
    a first semiconductor region formed in the semiconductor substrate under one side of the gate electrode; and
    a second semiconductor region formed in the semiconductor substrate such that the second semiconductor region is electrically connected to the first semiconductor region, wherein
    a first impurity concentration of the first semiconductor region is lower than a second impurity concentration of the second semiconductor region,
    the gate insulating film has a first portion which overlaps the first semiconductor region and a second portion which does not overlap the first semiconductor region, the first portion and the second portion located next to each other in a gate length direction,
    the first portion has a third portion and a fourth portion located next to each other in the gate length direction, the third portion includes the first insulating film, the charge storage layer and the second insulating film,
    the fourth portion includes the first insulting film and the second insulating film,
    the charge storage layer is not included in the fourth portion,
    the fourth portion is disposed adjacent an edge of the gate electrode, and
    the gate insulating film does not overlap the second semiconductor region.

2. The nonvolatile semiconductor device according to claim 1,
    wherein an overlapping amount of the charge storage layer and the first semiconductor region is in a range of 10 to 30 nm.

3. The nonvolatile semiconductor device according to claim 1,
    wherein an effective channel length of the field effect transistor is less than or equal to 30 nm.

4. The nonvolatile semiconductor device according to claim 1,
    wherein an effective channel length of the field effect transistor is less than or equal to 20 nm.

5. The nonvolatile semiconductor device according to claim 1,
    wherein electrons are injected in the charge storage layer so as to raise a threshold voltage of the field effect transistor, and holes generated by the interband tunneling phenomenon are injected in the charge storage layer so as to reduce the threshold voltage of the field effect transistor.

6. The nonvolatile semiconductor device according to claim 1,
    wherein the charge storage layer is a silicon nitride film or a stacked film formed by depositing a silicon nitride film containing oxygen on a silicon nitride film.

7. The nonvolatile semiconductor device according to claim 1,
    wherein the first insulating film and the second insulating film are insulators made from a material different from that of the charge storage layer.

8. The nonvolatile semiconductor device according to claim 7,
    wherein a thickness of the first insulating film is in a range of 1 to 10 nm, a thickness of the charge storage layer is in a range of 5 to 20 nm, and a thickness of the second insulating film is in a range of 5 to 15 nm.

9. The nonvolatile semiconductor device according to claim 7,
    wherein the first insulating film and the second insulating film are silicon oxide films, and the charge storage layer is a silicon nitride film or a stacked film formed by depositing a silicon nitride film containing oxygen on a silicon nitride film.

10. The nonvolatile semiconductor device according to claim 7,
wherein the charge storage layer has more discrete trap states than the first insulating film and the second insulating film.

11. The nonvolatile semiconductor device according to claim 1, wherein
a length of the third portion is less than 40 nm.

* * * * *